US010594276B2

(12) United States Patent
Jones et al.

(10) Patent No.: US 10,594,276 B2
(45) Date of Patent: Mar. 17, 2020

(54) MULTI-PATH AMPLIFIER CIRCUIT OR SYSTEM AND METHODS OF IMPLEMENTATION THEREOF

(71) Applicant: NXP USA, Inc., Austin, TX (US)

(72) Inventors: Jeffrey Kevin Jones, Chandler, AZ (US); Damon G Holmes, Scottsdale, AZ (US); Jeffrey Spencer Roberts, Tempe, AZ (US); Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/026,271

(22) Filed: Jul. 3, 2018

(65) Prior Publication Data

US 2020/0014342 A1    Jan. 9, 2020

(51) Int. Cl.
| | |
|---|---|
| *H03F 3/68* | (2006.01) |
| *H03F 3/21* | (2006.01) |
| *H03F 3/193* | (2006.01) |
| *H01L 29/20* | (2006.01) |
| *H03F 3/24* | (2006.01) |
| *H04B 1/04* | (2006.01) |

(52) U.S. Cl.
CPC .......... *H03F 3/211* (2013.01); *H01L 29/2003* (2013.01); *H03F 3/193* (2013.01); *H03F 3/24* (2013.01); *H03F 2203/21106* (2013.01); *H04B 2001/0408* (2013.01)

(58) Field of Classification Search
CPC .................................. H03F 1/0288; H03F 3/68
USPC .................................................. 330/295, 307
See application file for complete search history.

(56) References Cited

U.S. PATENT DOCUMENTS

| 9,654,155 | B2 | 5/2017 | Lehtola | |
|---|---|---|---|---|
| 2003/0201833 | A1 | 10/2003 | Pengelly et al. | |
| 2008/0007330 | A1* | 1/2008 | Klingberg | H03F 1/0288 330/124 R |
| 2012/0019326 | A1 | 1/2012 | Deguchi et al. | |
| 2012/0086497 | A1* | 4/2012 | Vorhaus | H01L 27/0207 327/427 |
| 2014/0312976 | A1* | 10/2014 | Noori | H03F 1/0288 330/295 |
| 2018/0026583 | A1* | 1/2018 | Yanduru | H03F 1/0288 330/289 |

FOREIGN PATENT DOCUMENTS

JP      2000-040705 A     2/2000

* cited by examiner

*Primary Examiner* — Steven J Mottola

(57) ABSTRACT

Power amplifiers such as multi-path power amplifiers, systems employing such amplifiers, and methods of implementing amplifiers and amplifier systems are disclosed herein. In one example embodiment, a multi-path power amplifier includes a first semiconductor die with an integrated first transistor having a first source-to-drain pitch, and a second semiconductor die with an integrated second transistor having a second source-to-drain pitch, where the second source-to-drain pitch is smaller than the first source-to-drain pitch by at least 30 percent. In another example embodiment, a Doherty amplifier system includes a first semiconductor die with a first physical die area to total gate periphery ratio, and a second semiconductor die with a second physical die area to total gate periphery ratio, where the second physical die area to total gate periphery ratio is smaller than the first physical die area to total gate periphery ratio by at least 30 percent.

20 Claims, 13 Drawing Sheets

MULTI-PATH AMPLIFIER CIRCUIT OR SYSTEM AND METHODS OF IMPLEMENTATION THEREOF

CROSS-REFERENCE TO RELATED APPLICATIONS

Not Applicable

STATEMENT REGARDING FEDERALLY SPONSORED RESEARCH OR DEVELOPMENT

Not Applicable

FIELD OF THE DISCLOSURE

The present disclosure relates to electrical circuits and systems and methods of operating, manufacturing, or otherwise implementing same and, more particularly, to such electrical circuits, systems, and methods in which the electrical circuits or systems serve as multi-path power amplifiers such as Doherty power amplifiers.

BACKGROUND OF THE DISCLOSURE

High-efficiency power amplifier (PA) design is increasingly becoming an integral part of wireless communication systems. The cellular base station market is slowly transitioning to gallium-nitride (GaN) based radio frequency (RF) products that are expected to be suitable for fifth generation (5G) communications. Improvement of the final-stage PA performance characteristics such as gain, output power, linearity, and DC-RF conversion efficiency remains a focus for researchers now within the context of stringent massive multiple input multiple output (MIMO) 5G specifications.

In many implementations that employ Doherty PA circuits or other multi-path PA circuits, the physical die area is of key concern, as power transistor products included in commercial wireless infrastructure systems have become increasingly cost-sensitive as well as area/volume/weight sensitive. With GaN technology, this is particularly important as the technology per square millimeter is significantly more expensive than that of silicon (Si) or other III-V based semiconductors. Because GaN is not manufactured on a native substrate, lattice mismatch prevents growing wafer size beyond approximately six inches in diameter. Accordingly, each GaN wafer tends to yield fewer power transistor die than are typically achievable using Si wafer technology.

For at least these reasons, therefore, it would be advantageous if one or more improved electrical circuits, systems, or methods of operating, manufacturing, or otherwise implementing same, and particularly one or more improved PA circuits, PA systems, or related PA methods, could be developed in which improvements relating to any one or more of the above concerns, or one or more other concerns, could be achieved.

DETAILED DESCRIPTION

The present disclosure relates to a variety of circuits, systems, and methods of operating, manufacturing, or otherwise implementing such circuits or systems, and particularly in at least some embodiments relates to Doherty or other multi-path power amplification or power amplifier (PA) circuits, systems, and methods of operating, manufacturing, or otherwise implementing same. More particularly, embodiments of the present invention include power transistor dies with source vias that are arranged in a manner that enables the source-to-drain pitch of the power transistor to be reduced, when compared with the source-to-drain pitch of conventional power transistor dies. Further, embodiments of the present invention include multi-path amplifiers in which a power transistor die of a first amplification path (e.g., a main amplification path of a Doherty power amplifier) includes a first power transistor with a first source-to-drain pitch, and a second power transistor die of a second amplification path (e.g., a peaking amplification path of a Doherty power amplifier) includes a second power transistor with a second source-to-drain pitch that is substantially smaller than the first source-to-drain pitch. As used herein, the term "source via" refers to a metal (e.g., gold or copper) connection that extends between two or more layers of a wafer and, typically, electrically links the source of a transistor on one side of a wafer through a substrate to a back metallized layer, and the term "source-to-drain pitch" refers to a distance between the centers of a source contact and a drain contact for a given transistor finger as described further below. Although the present specification uses a Doherty power amplifier as an example of a type of multi-path amplifier in which embodiments of the present invention may be implemented, those of skill in the art would understand, based on the description herein, that embodiments of the present invention may be implemented in other types of multi-path amplifiers, as well. In general, a "multi-path amplifier" is a type of amplifier in which RF signals are amplified through two or more parallel amplification paths.

Figure 1:
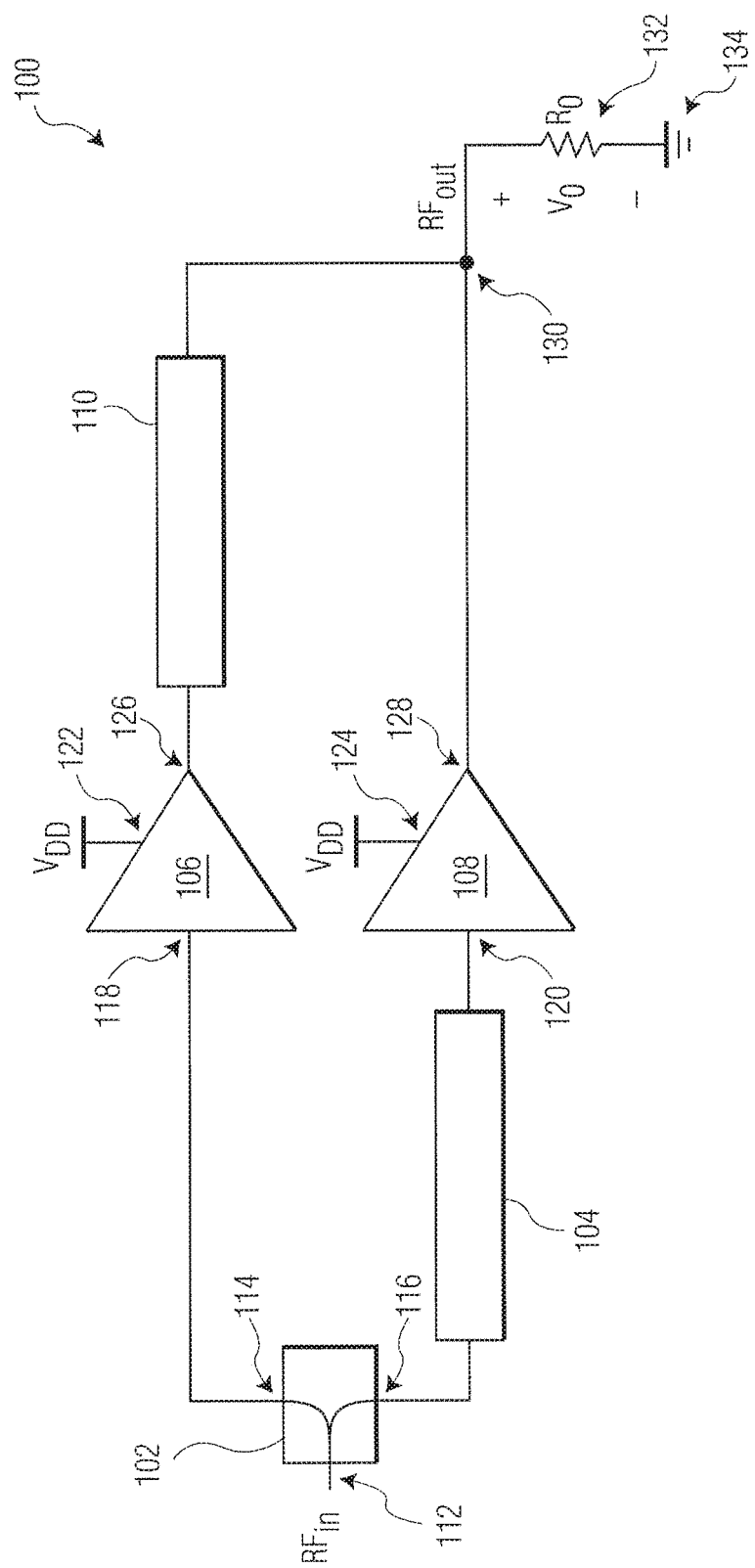
FIG. 1 is a schematic diagram illustrating an example Doherty power amplifier circuit that can employ a size-optimized set of power transistor dies with improved size/cost characteristics in accordance with embodiments encompassed herein.

Referring to FIG. 1, a schematic diagram is provided to show an example Doherty power amplifier (PA) circuit 100 that can employ a size-optimized set of power transistor dies with improved size/cost characteristics in accordance with embodiments encompassed herein. The circuit 100 can be considered to represent an ideal Doherty input and output configuration. As shown, the Doherty PA circuit 100 particularly includes a power divider 102, a first 90 degree phase shift element 104 (e.g., a quarter wave transmission line), a main (or carrier) amplifier circuit 106, a peaking amplifier circuit 108, and a second 90 degree phase shift and impedance inversion element 110 (e.g., a second quarter wave transmission line or transformer section). The power divider 102 particularly includes an input port 112 at which a RF input signal (RFin) is received by or input to the circuit 100. The power divider 102 may serve to split the RF input signal into two portions with ratios appropriate for the level of asymmetry between the carrier and peaking paths, and the signals are respectively output at first and second output ports 114 and 116 of the power divider 102.

As shown, the first output port 114 of the power divider 102 is coupled to an input port 118 of the main amplifier circuit 106, such that the first portion of the RF input signal is delivered from the power divider 102 to the main amplifier circuit 106. The first phase shift element 104 is coupled in series between the second output port 116 of the power divider 102 and an input port 120 of the peaking amplifier circuit 108. Thus, the second portion of the RF input signal that is output at the second output port 116 is received at the input port 120 of the peaking amplifier circuit only after passing through the first phase shift element 104, which causes that second half of the RF input signal received by the peaking amplifier circuit to be delayed by a quarter wavelength (90 degrees) relative to the first half of the RF input signal received by the main amplifier circuit 106. In other embodiments, delay elements in both the main and peaking amplification paths may be used to achieve the 90 degree difference between the RF input signals arriving at the input ports 118, 120 of the main and peaking amplifier circuits 106, 108. Additionally as shown, each of the main amplifier circuit 106 and the peaking amplifier circuit 108 includes a respective power terminal 122 and 124, respectively, by which the respective amplifier circuits are coupled to receive bias voltages from a power supply, which in the present example is shown to have a voltage $V_{DD}$. Each of the amplifiers 106, 108 also include a ground reference terminal (not illustrated) by which portions of the respective amplifier circuits may be electrically connected to a ground reference.

Additionally, upon receiving the first portion of the RF input signal at the input port 118, the main amplifier circuit 106 amplifies that signal so as to generate a first amplified signal, which is then output at a first output terminal 126 of the main amplifier circuit 106. Likewise, the peaking amplifier circuit 108 upon receiving the delayed second portion of the RF input signal at the second input port 120 operates to amplify that signal so as to generate a second amplified signal, which is then output at a second output terminal 128 of the peaking amplifier circuit 108.

Although FIG. 1 shows the main amplifier circuit 106 and the peaking amplifier circuit 108, it should be appreciated that each of these circuits typically includes (or even primarily consists of) a respective single-stage integrated power transistor or multi-stage integrated power transistor that provides the desired amplification. Each of the transistors in each of the main amplifier circuit 106 and peaking amplifier circuit 108 can take the form of, for example, a metal-oxide-semiconductor field-effect transistor (MOSFET). Typically a gate terminal of such a MOSFET will be the input terminal for the respective amplifier circuit, and a drain terminal of such a MOSFET will be the output terminal for the respective amplifier circuit. A source terminal of such a MOSFET may be electrically coupled to a ground reference (e.g., utilizing a source via integrated within the semiconductor die). In other embodiments, other types of transistor devices (e.g., bipolar junction transistors (BJTs), high-electron-mobility transistors (HEMTs), hetero-junction bipolar transistors (HBTs), etc.) can be employed in forming the amplifier circuits. It should be appreciated that, in the description provided below, references to the peaking amplifier circuits and to main amplifier circuits can also be understood as references to such transistors included by (or constituting the primary components of) such amplifier circuits.

Further as shown, the Doherty PA circuit 100 includes a combining node 130 that can also be considered to be an output terminal of the circuit 100 overall. The second output terminal 128 of the peaking amplifier circuit 108 is coupled directly to the combining node 130 (and thus the second output terminal 128 is electrically the same node as the combining node 130). By contrast, the first output terminal 126 of the main amplifier circuit 106 is coupled to the combining node 130 by way of the second phase shift and impedance inversion element 110. Thus, the first amplified signal that is output at the first output terminal 126 is delayed by a quarter wavelength (90 degrees) before being combined with the second amplified signal provided at the second output terminal 128 at the combining node 130. Accordingly, the delayed first amplified signal provided via the second phase shift and impedance inversion element 110 and the second amplified signal provided at the second output terminal 128 are combined in-phase at the combining node 130 so as to constitute a power dependent combination signal that can be considered an RF output signal (RFout) of the Doherty PA circuit 100. The RF output signal can then be delivered to a load 132, where the load is coupled between the combining node 130 and a ground terminal 134 and where the load does not constitute a part of the Doherty PA circuit 100.

It will be appreciated that in FIG. 1, the load 132 is represented by a resistor having a resistance $R_O$ (such that voltage across the load can be considered $V_O$) but that, notwithstanding the showing of the load 132 in this manner, the load can have any arbitrary impedance (or resistance or reactance) value depending upon the implementation or embodiment. Also, it should be appreciated that other components shown in FIG. 1 can, in any particular implementation or embodiment, have any of a variety of values.

The Doherty PA circuit 100 of FIG. 1 is intended to be representative of a variety of configurations of Doherty PA circuits. In particular, it should be appreciated that, although in some embodiments the main amplifier circuit 106 can be identical or substantially identical in characteristics and operation to the peaking amplifier circuit 108, in other embodiments the two amplifier circuits need not be identical or substantially identical in characteristics and performance. When the main and peaking amplifier circuits are identical or substantially identical in terms of die (or transistor) periphery, the Doherty PA circuit 100 can be referred to as a symmetric Doherty PA circuit, and when the main and peaking amplifier circuits are not identical in terms of die (or transistor) periphery, the Doherty PA circuit can be referred to as an asymmetric Doherty PA circuit. In many embodiments encompassed herein, asymmetric Doherty PA circuits are of particular interest insofar as differences in operation between the peaking and main amplifier circuits allow for differing levels of physical size optimization.

Figure 2:
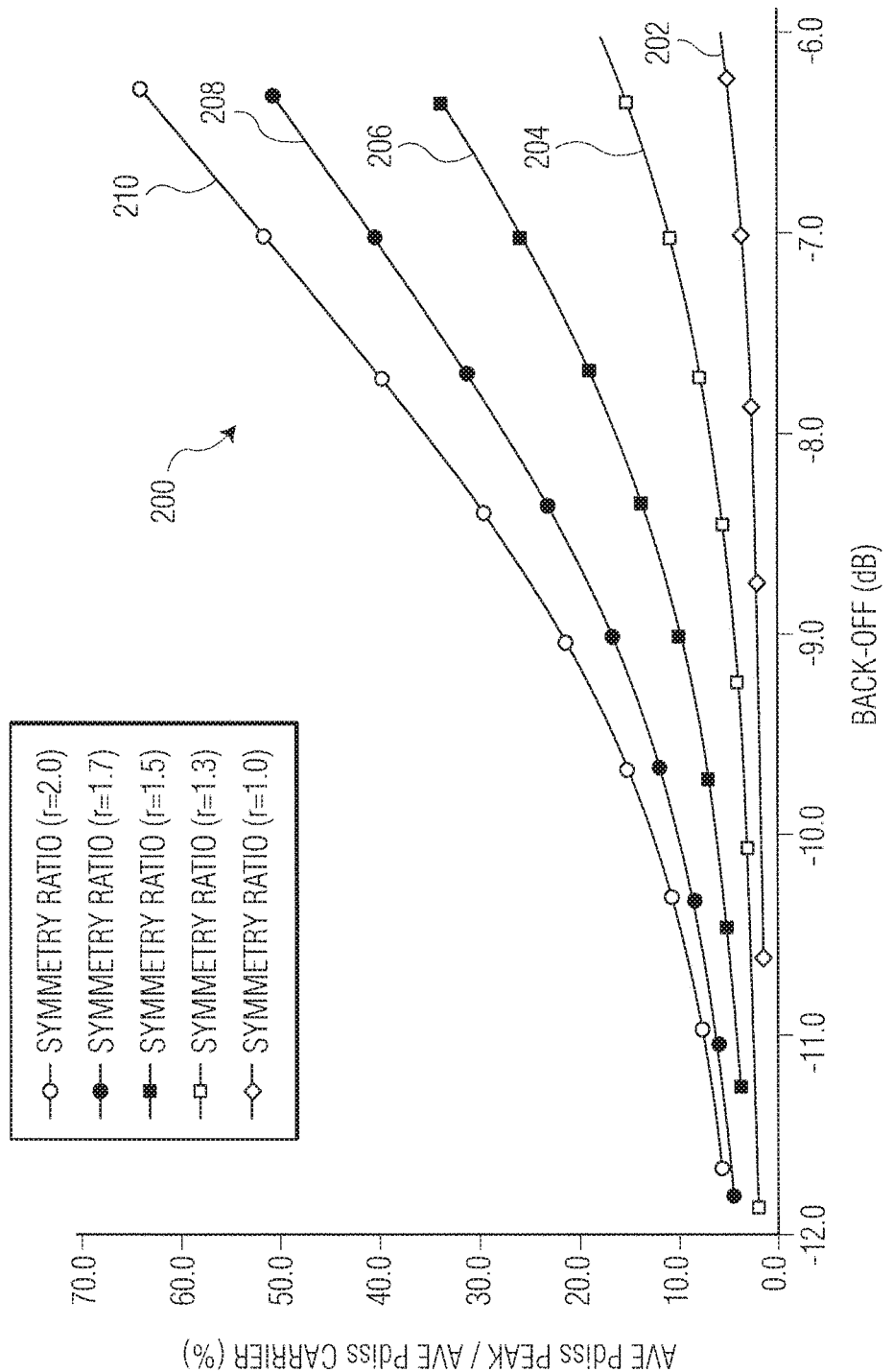
FIG. 2 is a graph showing example variation in the ratio of average peaking amplifier power dissipation relative to average main power amplifier power dissipation versus output power back-off (in dB) for a variety of Doherty power amplifier circuits represented by FIG. 1 that have varying symmetry ratios.

Turning to FIG. 2, based upon a simulation of a Doherty PA circuit using a WCDMA signal, it is further possible to plot the ratio of power dissipation in the peaking die in comparison with the main (or carrier) die, as it applies to a level of peak power OBO (output backoff), as well as to the symmetry (or asymmetry) level of the Doherty circuit. Such a methodology simulation can be applied to simplified models, as well as to various specific product-level models that include some or all details of the die, package, internal and external matching circuits, interconnects, and thermal interfaces. If one assumes that the thermal interface is the same for both the main (or carrier) die and the peaking die, then the peaking die physical area can be reduced while maintaining less than or substantially equal power dissipation density and better or substantially equal thermal performance as it compares to the main die.

FIG. 2 is particularly intended to show the ratio of the average peaking amplifier power dissipation relative to the average main (or carrier) power amplifier dissipation versus OBO for various symmetry (or asymmetry) ratios of example Doherty PA circuits. As illustrated, the graph 200 of FIG. 2 includes first, second, third, fourth, and fifth curves 202, 204, 206, 208, and 210, which respectively show the ratio of the average peaking amplifier power dissipation to the average main amplifier power dissipation for five different exemplary PA circuits having five different symmetry ratios (r), namely, r=1.0, r=1.3, r=1.5, r=1.7, and r=2.0, respectively. Among other things, it can be seen from FIG. 2 that generally the ratio of average peaking amplifier power dissipation to average main amplifier power dissipation increases from between 0 percent (%) and 10% to higher levels as one proceeds from OBO values of approximately negative 12 dB to an OBO value of negative 6 dB. Also in general, it should also be appreciated from FIG. 2 that, as the Doherty PA circuit becomes increasingly asymmetric, the power that is dissipated during operation of the Doherty PA circuit is increasingly dissipated by way of the peaking amplifier circuit portion thereof. Significantly, in modern communications systems, the Doherty PA circuits are typically operating between −10 dB OBO and −8 dB OBO. Thus, in an embodiment with r=2.0, which would represent the greatest asymmetry in the example illustrated by FIG. 2, the average power dissipation of the peaking amplifier never attains more than about 30% to 40% (e.g., more than about 35%) of what is dissipated in the main amplifier up to about −8 dB OBO.

Figure 3:
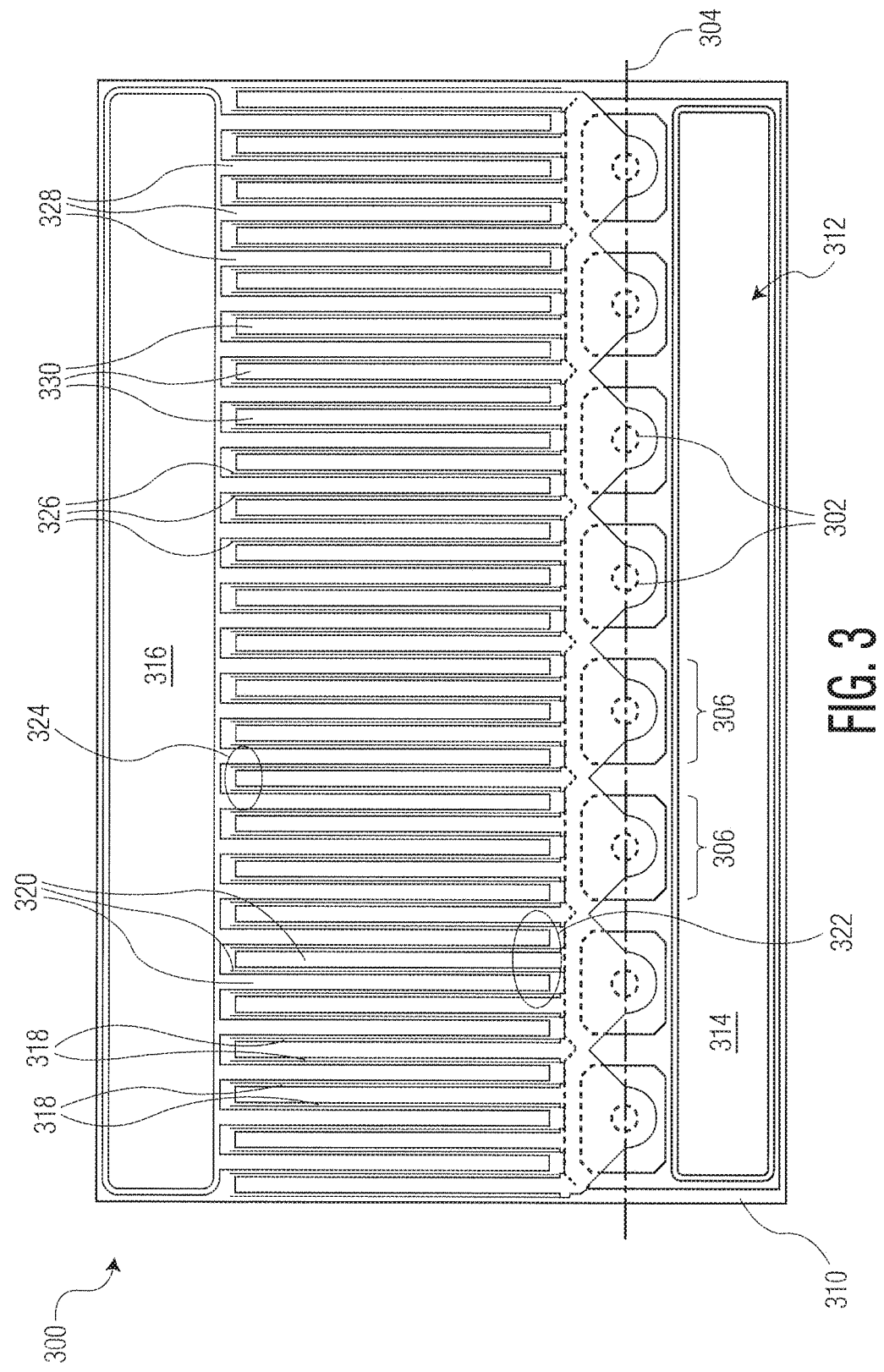
FIG. 3 is a top plan view of an example die that can be utilized in providing a size-optimized peaking amplifier constituting part of a Doherty power amplifier circuit such as that represented by FIG. 1.
Figure 4:
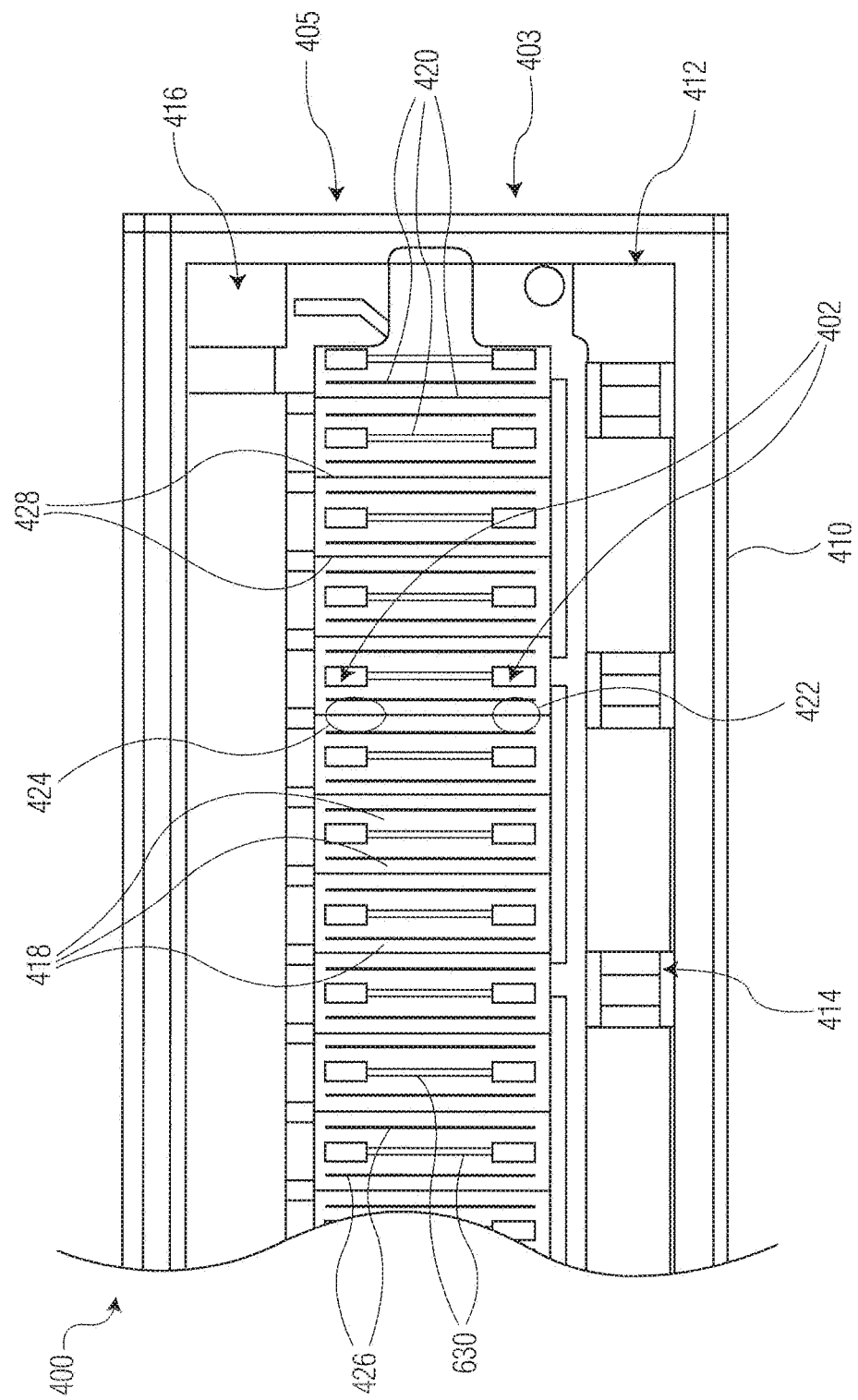
FIG. 4 is a cut away top plan view of an example alternate die that, although being suitable for use in providing a conventional peaking power amplifier, can also be utilized in providing a main (or carrier) power amplifier that can be part of a Doherty power amplifier circuit such as that represented by FIG. 1.

Referring now to FIG. 3 and FIG. 4, top plan views (and, in the case of FIG. 4, a cut away top plan view) are shown of a first die 300 and a portion of a second die 400, where the first and second dies 300, 400 have power transistors with different arrangements of source vias that result in different source-to-drain pitches. The first die 300 of FIG. 3 is a die in accordance with one embodiment of the present disclosure that achieves a substantial reduction in die area relative to conventional die arrangements, and the second die 400 of FIG. 4 by comparison is an example of a conventional die arrangement. As will be described in further detail below, the first die 300 of FIG. 3 has features by which that die is significantly shrunk in physical area while still maintaining an acceptable source inductance by comparison with conventional die arrangement such as the second die 400 of FIG. 4. By virtue of these features potentially enabling equivalent RF performance characteristics such as gain, power capability, and efficiency, the first die 300 can be substantially smaller in physical size (e.g., 30% to 60% smaller or more) by comparison with the second die 400 and yet achieve the same or substantially the same functional objectives as the second die 400 in terms of amplification or other signal processing.

Further, when the first die 300 with the first arrangement of source vias is utilized as a peaking amplifier die of a Doherty PA, the performance of the Doherty PA may be substantially the same as if a conventional peaking amplifier die were utilized, while enabling the peaking amplifier die area to be significantly reduced. In a conventional Doherty PA, the power transistors in the main and peaking dies may have substantially the same source-to-drain pitch, with the heat-sink structure being designed to handle relatively-high dissipated power by the main (or carrier) transistor of the Doherty PA, and yet with the same or a similar heat-sink structure also being utilized to handle the relatively-low dissipated power by the peaking transistor. In contrast to such conventional Doherty PAs, an improved Doherty PA in accordance with at least some embodiments encompass herein will employ the first die 300 as the peaking amplifier die. In this regard, it should be appreciated that the first die 300 is an example die having a layout that utilizes a mathematical analysis of a Doherty PA that receives modulated signals, and under a variety of simulated asymmetry levels between the main (or carrier) and peaking die periphery. So as to shrink the peaking die area, the layout of the source vias is modified to allow a tighter source-to-drain pitch, when compared with conventional dies (such as that of FIG. 4), without a substantial increase in the effective source inductance. According to various embodiments, modifying the peaking transistor layout to shrink peaking die area, when compared with conventional peaking dies, without bringing power dissipation density in the peaking die to be at or above that of the carrier die, creates little or no impact to the design of the heat-sink structures, while significantly reducing the overall area used for the total die periphery (e.g., peaking die periphery plus carrier die periphery).

Although the first die 300 and second die 400 differ in numerous respects from one another, each of the two dies do share certain features in common. In particular, each of the first die 300 and second die 400 includes a respective base substrate 310 and 410, respectively, having top and bottom surfaces. Also, each of the first die 300 and second die 400 includes a respective build-up structure 312 and 412, respectively, which is formed over the respective top surface of the respective base substrate 310 and 410, respectively. Each of the build-up structures 312 and 412 includes a respective alternating arrangement of a plurality of patterned conductive layers and a plurality of dielectric layers, each of which is formed over and coupled to the respective top surface of the respective base substrate 310 or 410. It should be appreciated that the respective exterior surfaces of the respective build-up structures 312 and 412 that are visible in FIG. 3 and FIG. 4, respectively, corresponds to the top surfaces of the respective dies 300 and 400. In various embodiments, the base substrates (or base semiconductor substrates) 310 and 410 may comprise gallium nitride (GaN), GaN on silicon carbide, GaN on silicon, silicon, gallium arsenide (GaAs), or other types of substrate materials. Electrical connections between the top and bottom surfaces of the base substrate may be made using conductive through substrate vias (TSVs). In the embodiments of FIG. 3 and FIG. 4 in particular, the first die 300 includes a plurality of source vias 302 and the second die 400 includes a plurality of source vias 402, with the source vias 302 being shown in dashed lines because the source vias do not extend entirely up to the top surface of the first die 300.

Further with respect to FIG. 3 and FIG. 4, it should be appreciated that each of the first die 300 and second die 400 includes a respective active device (e.g., transistor) that includes a respective plurality of parallel, elongated transistor contacts or fingers 320 or 420, each of which extends generally between a respective gate pad (or gate bond pad) 314 or 414 of the respective die and a respective drain pad (or drain bond pad) 316 or 416 of the respective die. Additionally, each of the first die 300 and second die 400 includes a respective plurality of elongated channel regions 318 or 418, respectively, where the respective channel regions particularly include the spaces between neighboring ones of the respective contacts 320 or 420. Each of the respective elongated channel regions 318 or 418 has a respective proximal end 322 or 422 adjacent or proximate to the respective gate pad 314 or 414, and a respective distal end 324 or 424 adjacent to the respective drain pad 316 or 416.

Additionally, in each of the first die 300 and the second die 400, each of the respective pluralities of contacts 320 and 420 particularly includes a respective plurality of elongated gate contacts 326 and 426, a respective plurality of elongated drain contacts 328 and 428, and a respective plurality of elongated source contacts 330 and 630. The elongated gate contacts 326 and 426 respectively extend from the respective gate pad 314 or 414 toward (but not to) the respective drain pad 316 or 416, and the elongated drain contacts 328 and 428 respectively extend from the respective drain pads 316 or 416, toward (but not to) the respective gate pad 314 or 414. The respective gate contacts 326 and 426 generally overlie the elongated channel regions 318 and 418, respectively, and the respective gate pads 314 or 414 electrically connect all of the respective elongated gate contacts of the respective pluralities of elongated gate contacts 326 and 426. In other embodiments, multiple gate pads may be implemented, where each gate pad electrically connects a subset of the gate contacts.

Additionally, the respective drain contacts 328 and 428 generally extend along respective first sides of respective ones of the elongated channel regions 318 and 418, respectively, and the respective source contacts 330 and 630 generally extend along respective second sides (opposite the first sides) of respective ones of the elongated channel regions 318 and 418, respectively. More particularly with respect to the drain contacts 328 and 428, the respective drain pads 316 and 416 electrically connect all of the respective elongated drain contacts of the respective pluralities of elongated drain contacts 328 and 428. As with the gate pads discussed above, in other embodiments, multiple drain pads may be implemented, where each drain pad electrically connects a subset of the drain contacts. Further, as will be described in more detail below, each one of the elongated source contacts 330 and 630 is electrically coupled to one or more of the source vias 302 and 402, respectively. Each of the source vias 302 and 402 extends through the respective base substrate 310 and 410 to provide a conductive path between one or more of the source contacts 330 and 630 that are coupled to the respective source via and the respective bottom surface of the respective die 300 and 400 (e.g., and to a conductive layer on the bottom surface of the respective die 300, 400 that serves as a ground reference). As used herein, the "source-to-drain pitch" refers to the distance (in a horizontal direction in FIGS. 3 and 4) between the centers of neighboring ones of the source contacts 330, 630 and the drain contacts 328, 428. Further, although the terms "contact" and "finger" have been used synonymously above, to the extent that a transistor "finger" can also be considered to be a grouping of a neighboring pair of a source contact and a drain contact on a die, the "source-to-drain pitch" can accordingly also refer to the distance (in a horizontal direction) between the centers of a pair of source and drain contacts of a given transistor finger.

Notwithstanding the above description concerning the first die 300 and the second die 400 as discussed above, a comparison of the first die 300 with the second die 400 of FIG. 3 and FIG. 4, respectively, illustrates differences between the two dies. These differences allow for the first die 300 to have a substantial reduction in die area while potentially attaining substantially the same levels of operation as a conventional die such as the second die 400. In particular, it should be appreciated that, in the first die 300, there are a plurality of the source vias 302 that are arranged along a single axis or row 304, which can be understood as defining an X-dimension of the first die 300. Further, it should be appreciated that each of the source vias 302 of the row 304 is positioned (as illustrated) adjacent to (below, in FIG. 3) the proximal ends 322 of a respective grouping of two or more (typically a pair) of the source contacts 330. In the present example embodiment, the source vias 302 are circular in cross-section, with a diameter having an extent that approximates the distance between two neighboring ones of the source contacts 330. In alternate embodiments, the source vias 302 can have other shapes or sizes. For example, in an alternate embodiment, each of the source vias can have a cross-sectional shape that is oval, with a major axis (aligned with or parallel to the row 304) being larger than a minor axis (perpendicular to the major axis and within, or parallel to, the top surface of the first die 300).

In the present embodiment, each of the source vias 302 particularly is electrically connected or coupled with a respective subset of the source contacts 330 that are aligned or nearly aligned with the respective source via. In the present example, three (or four) of the source contacts 330 are electrically connected or coupled with each respective one of the source contacts, although in other embodiments it is possible that a different number of the source contacts (e.g., one, two, five, or six) would be coupled to each respective source via. Accordingly, in the present embodiment as illustrated, the first die 300 includes a plurality of portions 306, where each of the portions 306 includes a respective one of the source vias 302 and respective corresponding (aligned or nearly aligned) ones or groups of the source contacts 330 that are electrically connected or coupled to the respective source via. Although the present embodiment of FIG. 3 particularly illustrates the first die 300 as having eight of the portions 306 (corresponding to eight of the source vias 302), the number of portions that are present in any given die can vary depending upon the embodiment. Additionally, although the respective portions 306 are described above as particularly including respective ones of the source vias 302 and corresponding ones of the source contacts 330, the respective portions 306 also can be understood as including respective ones of the drain contacts 328 and respective ones of the channel regions 318 (and possibly also respective ones of the gate contacts 326) that are adjacent or proximate to the respective source contacts 330 within the respective portions.

Figure 5:
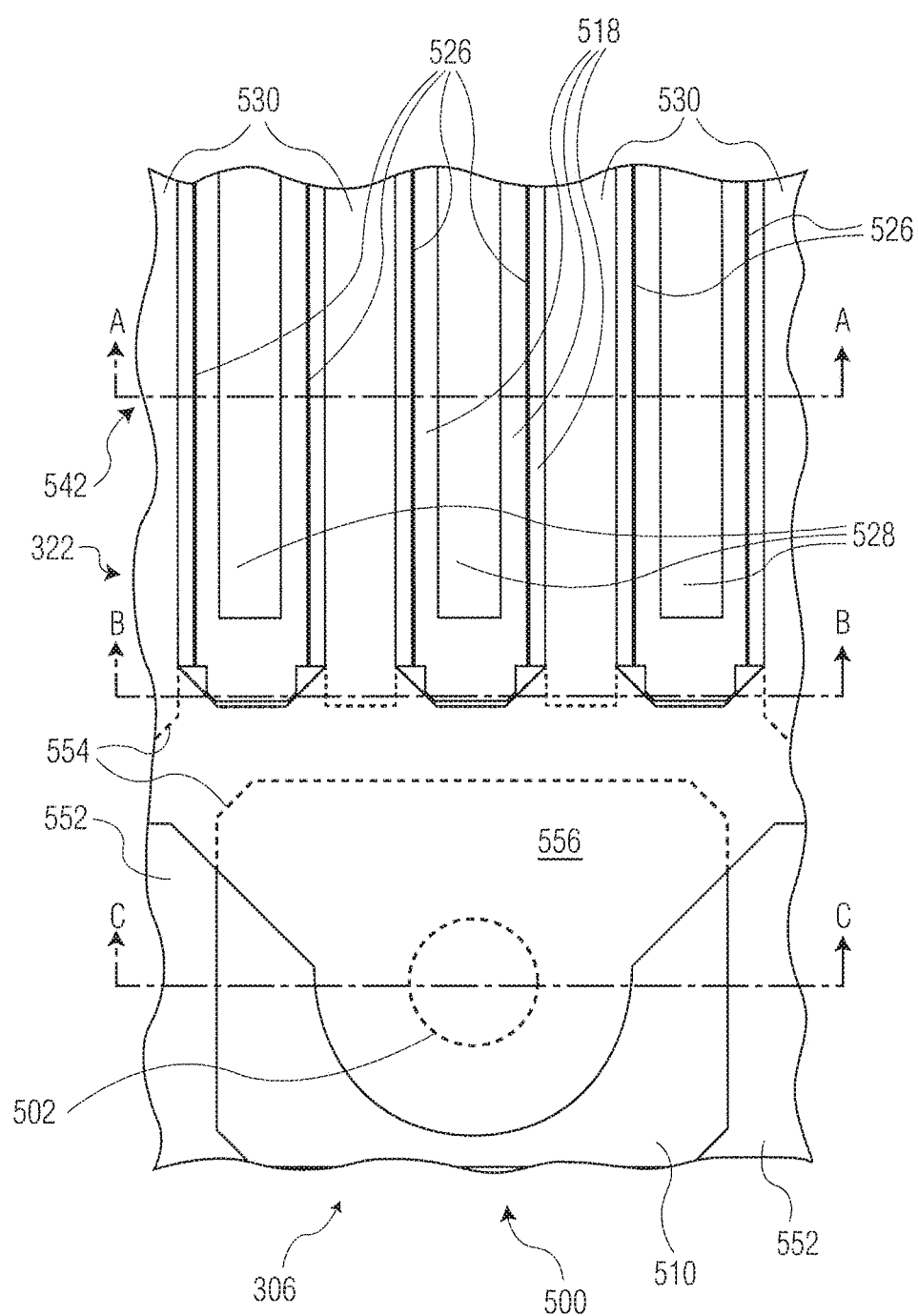
FIG. 5 is a cutaway top plan view of a portion of the example die of FIG. 3.
Figure 6:
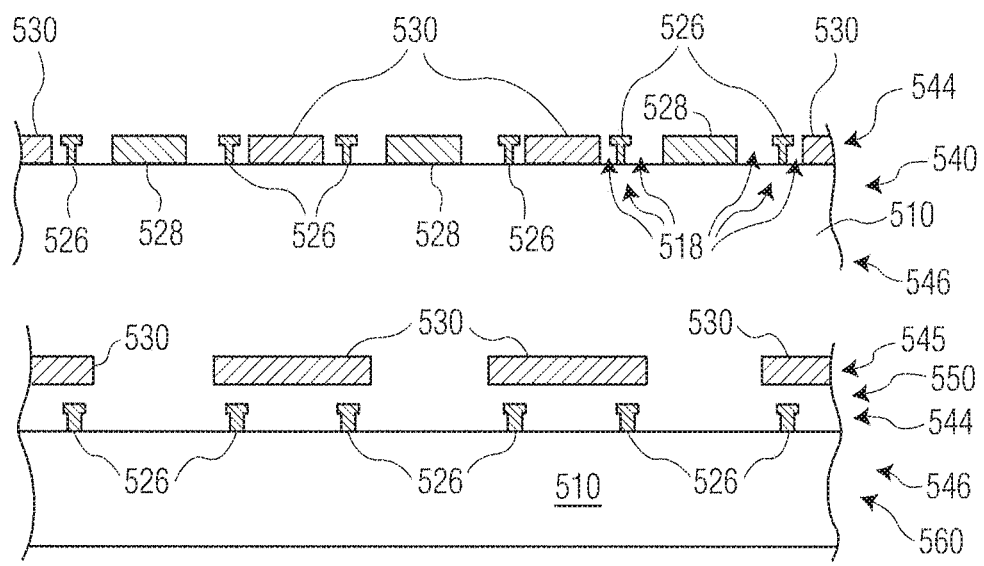
FIG. 6 is a set of first and second cross-sectional views of the portion of the example die of FIG. 5, taken respectively along lines A-A and B-B of FIG. 5.
Figure 7:
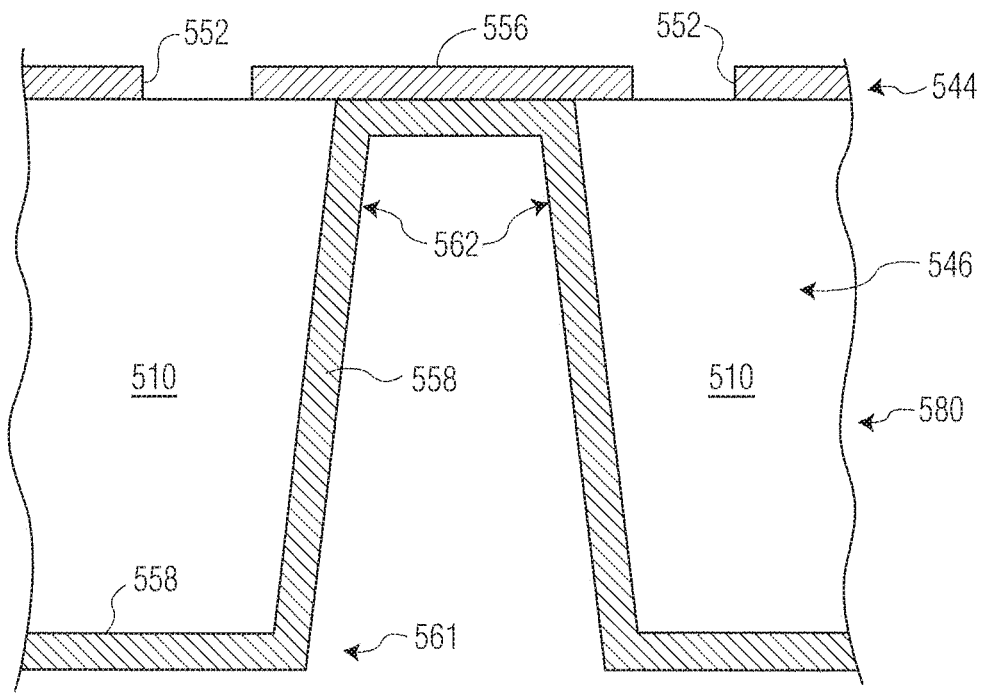
FIG. 7 is a third cross-sectional view of the portion of the example die of FIG. 5, taken along a line C-C of FIG. 5.

Referring additionally to FIGS. 5, 6, and 7, a cutaway top plan view is provided in FIG. 5 of a first one of the portions 306 of the first die 300, shown as a partial portion 500, along with several cross-sectional views of that partial portion in FIGS. 6 and 7. Although only the partial portion 500 is shown in FIG. 5, it will be appreciated that in many or most die arrangements, there will be multiple ones of the portions 306 positioned side-by-side one another in a manner similar to that shown in FIG. 3 in which the portions 306 are positioned side-by-side one after another. As shown in FIG. 5, the partial portion 500 includes a first source via 502, which is one of the source vias 302. Also, the partial portion 500 further includes a first plurality of (in this example, four) source contacts 530, which are among the source contacts 330, a first plurality of (in this embodiment, six) gate contacts 526, which are among the gate contacts 326, and a first plurality of (in this embodiment, three) drain contacts 528, which are among the drain contacts 328. Additionally, elongated channel regions 518, which are among the elongated channel regions 318, are positioned between the various ones of the contacts 330, 326, 328. It will be appreciated in view of FIG. 3 that, although not shown, the gate pad 314 exists in relation to the partial portion 500 proximate the first source via 502, and the drain pad 316 exists in relation to the partial portion 500 at the distal ends 324 (not shown in FIG. 5) of the elongated channel regions 518. All of the source via, source, gate, and drain contacts, and elongated channel regions 502, 530, 526, 528, and 518 respectively, are supported upon a substrate portion 510, which is a part of the base substrate 310 of the first die 300 of FIG. 3.

Further with respect to FIGS. 6 and 7, first, second, and third cross-sectional views 540, 560, and 580, respectively, are provided of the partial portion 500 of FIG. 5, to illustrate further how the various components of the partial portion are implemented relative to one another. With respect to FIG. 6, which particularly shows the first and second cross-sectional views 540 and 560, the first cross-sectional view 540 particularly is a cross-sectional view taken through the partial portion 500 along a line A-A of FIG. 5, and the second cross-sectional view 560 particularly is a cross-sectional view taken through the partial portion along a line B-B of FIG. 5. With respect to FIG. 7, which particularly shows the third cross-sectional view 580, that cross-sectional view particularly is a cross-sectional view taken through the partial portion 500 along a line C-C of FIG. 5. With respect to the first cross-sectional view 540, it will be appreciated that this cross-section is taken at a location along the partial portion 500 that is within a midregion 542, which is between the proximal and distal ends 322 and 324, respectively, of the elongated channel regions 318 including the elongated channel regions 518. The first cross-sectional view 540 shows in particular how the source contacts 530, the drain contacts 528, and the gate contacts 526 are all arranged substantially at a top level 544 of the partial portion 500, so as to be positioned above a lower level 546 at which is provided the substrate portion 510. Further it can be seen from the cross-sectional view 540 that the gate contacts 526 are generally positioned closer to the source contacts 530 than to the drain contacts 528. It should be appreciated from FIG. 6 that the elongated channels 518 actually can be considered channels that respectively extend between each pair of neighboring source and drain contacts (e.g., between each source-drain pair) and under each respective gate contact that is positioned between each pair of neighboring source and drain contacts, and additionally can be considered as being essentially embedded below the top surface of the lower level 546 corresponding to the substrate portion 510.

Further, with respect to the first cross-sectional view 540, it can be seen that as one proceeds from within the central portion of the midregion 542 toward an end of the midregion proximate the first source via 502, one eventually reaches the location of the line B-B at which the drain contacts 528 are no longer present, and at which the relative arrangement of the source contacts 530 and gate contacts 526 becomes different from that existing at the central portion of the midregion 542 (e.g., different from that existing at the first cross-sectional view 540 taken along the line A-A). In particular, it can be seen from the second cross-sectional view 560 that, at the location of the line B-B, the gate contacts 526 remain at the top level 544 but the source contacts 530 pass relatively upward so as to become located at a further top level 545 that is above the top level 544. Additionally it can be seen that, at the location of the line B-B, the source contacts 530 become widened relative to the widths of the source contacts at the midregion 542, such that the source contacts 530 overhang the gate contacts 526. So that the source contacts 530 remain electrically insulated from the gate contacts 526 at the location of the line B-B, an air gap (or dielectric layer) is provided at an additional level 550 that is above the top level 544 but below the further top level 545. The air gap (or dielectric layer) also exists within the top level 544 at regions in between the gate contacts 526.

It should be appreciated from FIG. 6, as well as FIG. 5, that this relative vertical arrangement of the gate contacts 526 and the source contacts 530 not only permits those contacts to remain electrically insulated from one another, but also permits the gate contacts 526 to be electrically connected/coupled to the gate pad 314 and the source contacts 530 to be electrically connected/coupled to the first source via 502 all while remaining electrically insulated. More particularly as illustrated by FIG. 5, in the present embodiment, the gate contacts 526 include or are integrally formed with connective portions 552 that pass around the first source via 502 and extend from those gate contacts 526 to the gate pad 314 (see FIG. 3). Also, the source contacts 530 include or are integrally formed with a connective portion 556 at which those source contacts become merged with one another, and that electrically connects/couples those source contacts with the first source via 502. As illustrated particularly by dashed lines 554, the connective portions 552 particularly include segments that are positioned underneath (with an air gap/dielectric layer therebetween) the connective portion 556 that electrically connects and couples the source contacts 530 with the source via 502. By virtue of this "underpass" arrangement in which the connective portion 556 extends over, and is electrically insulated from, the sections of the connective portions 552, the source contacts 530 remain electrically insulated from the gate contacts 526.

Additionally with respect to FIG. 7, the third cross-sectional view 580 additionally illustrates the relative arrangements of the components of the partial portion 500 at the line C-C of FIG. 5, which passes through the first source via 502. At this location, the connective portions 552 have already fully passed under the connective portion 556 and consequently all of the connective portions 552 and 556 are at the top level 544 above the lower level 546 corresponding to the substrate portion 510. Further at this location, it can be seen that the first source via 502 is formed by a backside metal layer 558. As illustrated, away from the location of the first source via 502, the backside metal layer 558 extends along a bottom level 561 that is below the lower level 546 (with the lower level being between the bottom level and the top level 544). However, at the position of the first source via 502, the backside metal layer 558 includes a substantially cup-like or conical formation 562 that proceeds upward through the lower level 546 and up to, so as to be in contact with and electrically connected/coupled to, the connective portion 556. It is particularly this substantially cup-like or conical formation 562 that can be considered as constituting the first source via 502, and gives rise to the illustration of the first source via in FIG. 5 as a circular structure. By virtue of this arrangement, the connective portion 556 and thus the source contacts 530 (but not the gate contacts 526 or drain contacts 528) are electrically connected/coupled to the backside metal layer 558 (and typically thereby to ground). This arrangement involving the first source via 502 (as with any of the source vias 302) can allow for power dissipation, can provide source inductance, can serve as a gain reducing component or arrangement, and can serve to provide negative feedback.

As is evident from a comparison of the second die 400 as shown in FIG. 4 relative to the first die 300 of FIGS. 3, 5, 6, and 7, the second die 400 has numerous features that differ from those described above in relation to the first die 300. In particular, as shown in FIG. 4, the source vias 402 of the second die 400 are arranged not only along a single row (such as the row 304) but rather are arranged in a first row 403 and a second row 405. Each respective source via 402 of the first row 403 is positioned between respective pairs of adjacent elongated contacts (e.g., between adjacent ones of the source and gate contacts 630 and 426, or between adjacent ones of the source and drain contacts 630 and 428). This is in contrast with the first die 300 of FIGS. 3, 5, 6, and 7, in which the source vias 302 such as the first source via 502 are positioned adjacent to (and at the ends of) the source contacts 330, rather than between the source contacts 330 and/or drain contacts 328. Further, in contrast to the first die 300 having the source vias 302 only along the row 304, the second row 405 of the source vias 402 is redundant to the first row 403 of the source vias in the second die 400.

Based upon FIGS. 3, 5, 6, and 7, it should be appreciated that the first die 300 of FIGS. 3, 5, 6, and 7 entails an arrangement in which the source-to-drain pitch of the first die 300 is shrunken by comparison with the source-to-drain pitch of the second die 400, which is greater. For example, the first die 300 can have a source-to-drain pitch that is at least 30% less than the source-to-drain pitch of the second die 400. Also, given these characteristics of the first die 300 relative to the second die 400, the first die 300 arrangement of FIGS. 3, 5, 6, and 7 achieves substantially more periphery in the same physical area than the second die 400 arrangement of FIG. 4. Stated in another manner, a first physical die area to total gate periphery ratio of the first die 300 is smaller than a second physical die area to total gate periphery ratio of the second die 400. Indeed, as a result of these differences, in the present example embodiment there can be a resulting improvement by a multiple of four in terms of the ratio of the periphery of the first die 300 relative to the periphery of the second die 400, or the physical die area to total gate periphery ratio of the first die 300 can be at least 30% smaller than the corresponding ratio for the second die 400.

By virtue of these differences between the first die 300 and the second die 400, it is possible to form an overall Doherty PA circuit employing the first die 300 as a peaking die and the second die 400 (or another conventional die) as a main (or carrier) die. Such a Doherty PA circuit employing the first die 300 as a peaking die can be substantially reduced in physical size relative to conventional Doherty PA circuits (which would not employ an improved die such as the first die 300 as a peaking die), and at the same time still achieve RF operation and thermal power dissipation that are desirable or acceptable from a performance standpoint. Indeed, although the first die 300 of FIGS. 3, 5, 6, and 7 is merely one example of a peaking die arrangement that is intended to be encompassed by the present disclosure, in this example the first die 300 is approximately 65% smaller in size than the second die 400. This reduced size of the first die 300 by comparison with the second die 400 is achieved even though the first die 300 in the present example embodiment has a slightly larger size as measured along its Y-dimension (the dimension perpendicular to the X-dimension corresponding to the row 503 and substantially parallel to the source contacts 330/to the top surface of the die) than does the second die 400 along its Y-dimension (the dimension perpendicular to either of the rows 403 or 405 and substantially parallel to the source contacts 630/to the top surface of the die). Thus, an overall Doherty PA circuit employing the first die 300 as a peaking die can be substantially smaller than conventional Doherty PA circuits that do not employ the first die 300.

Notwithstanding the reduced size of the first die 300 by comparison with the second die 400, an overall Doherty PA circuit employing the first die 300 as a peaking die and the second die 400 (or another conventional die) as a main die can achieve desirable or acceptable thermal power dissipation performance. In the present example embodiment, it is possible that the first die 300 when operated as a peaking die may experience somewhat higher temperatures than would be experienced by some conventional dies when serving as a peaking die. Nevertheless, in the present embodiment, the first die 300 can be operated as a peaking die in a manner such that it does not become substantially hotter during operation than the second die 400 (or other conventional die) forming the main die, and consequently the overall Doherty PA circuit will operate within desirable or acceptable levels from a thermal power dissipation standpoint. Further, such a Doherty PA circuit employing the first die 300 as a peaking die and the second die 400 (or another conventional die) as a main die also can achieve RF performance that is equal or substantially equal to that achieved by Doherty PA circuits employing a conventional die as a peaking die, particularly insofar as the RF performance achieved by way of the first die 300 is equal or substantially equal to that achieved by way of the second die 400 (or otherwise is acceptable).

It should be appreciated that, in at least some embodiments encompassed herein, the first die 300 is the only die or only type of die that is used in a given Doherty PA circuit, such that any one or more peaking amplifier circuits (e.g., the peaking amplifier circuit 108 of FIG. 1) that are present in the Doherty PA circuit is or are provided by the first die 300 or multiple such dies. Nevertheless, in some alternate embodiments encompassed herein, the second die 400 (or several of such dies) can also be employed in conjunction with the first die 300 in a given Doherty PA circuit.

For example, the die 400 can in some embodiments be utilized as a main (or carrier) die on which one or more main amplifier circuits (e.g., the main amplifier circuit 106 of FIG. 1) are formed. Thus, the present disclosure is also intended to encompass Doherty PA circuits having one or more peaking amplifier circuits provided by one or more dies of the form represented by the die 300, in combination with one or more main amplifier circuits provided by one or more dies of the form represented by the die 400. Given this to be the case, it should be appreciated that above-discussed examples of performance differences between the die 300 and die 400 in terms of source-to-drain pitch or physical die area to total gate periphery ratio can be present in a single Doherty PA circuit in which the die 300 serves to provide the peaking amplifier circuit and the die 400 serves to provide the main amplifier circuit.

More particularly, the present disclosure is intended to encompass embodiments of Doherty PA circuits (or other multi-path PA circuits or amplifier systems) having main and peaking amplifier circuits in which a physical die area to total gate periphery ratio associated with the peaking amplifier circuit (or a transistor employed in such circuit) is smaller than a physical die area to total gate periphery ratio associated with the main amplifier circuit (or a transistor employed in such circuit), by at least 30% or even higher. Also, the present disclosure is intended to encompass embodiments of Doherty PA circuits having main and peaking amplifier circuits in which a source-to-drain pitch associated with the peaking amplifier circuit (or a transistor employed in such circuit) is smaller than a source-to-drain pitch associated with the main amplifier circuit (or a transistor employed in such circuit), by at least 30% or even higher.

Figure 8:
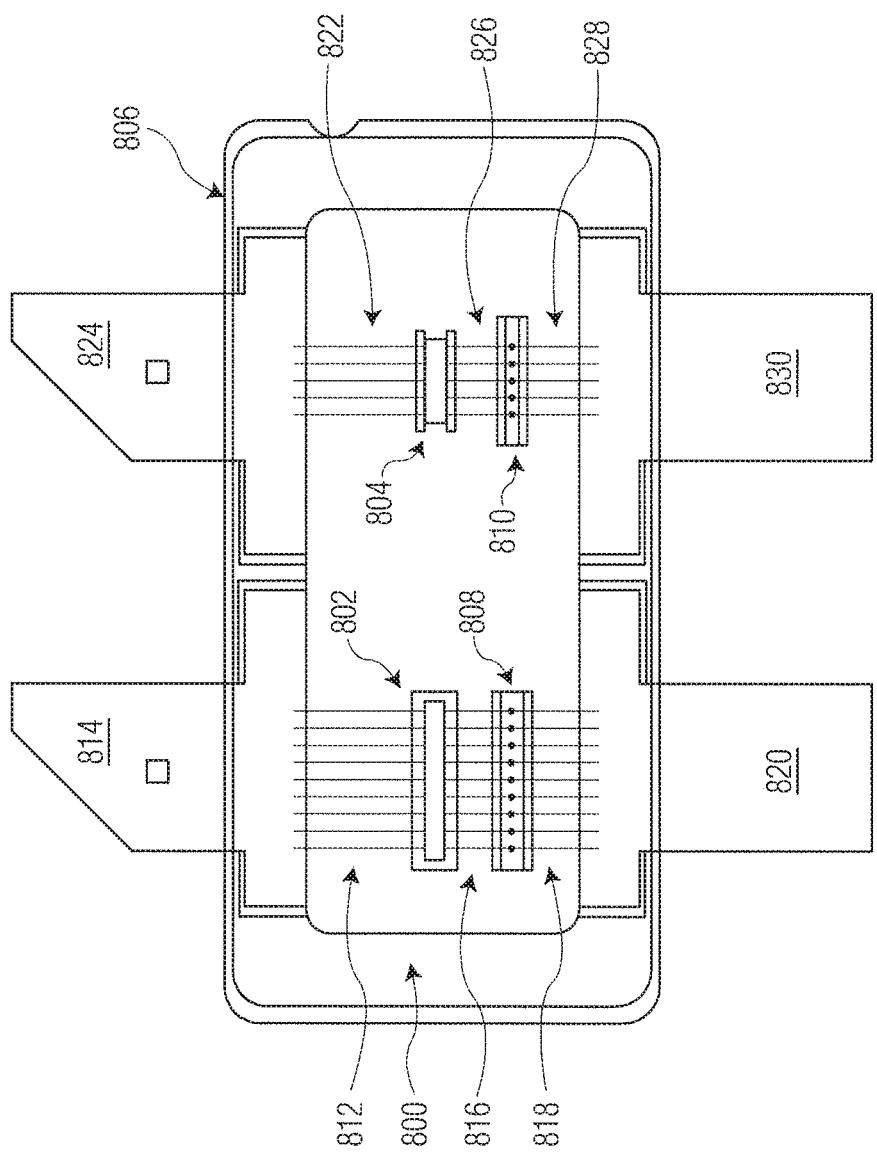
FIG. 8 is a top plan view of an example embodiment of a single-package implementation of a Doherty power amplifier circuit as represented (at least in part) by FIG. 1 that has a main amplifier and a size-optimized peaking amplifier, which can for example be provided by a portion of the die of FIGS. 3, 5, 6, and 7.
Figure 9:
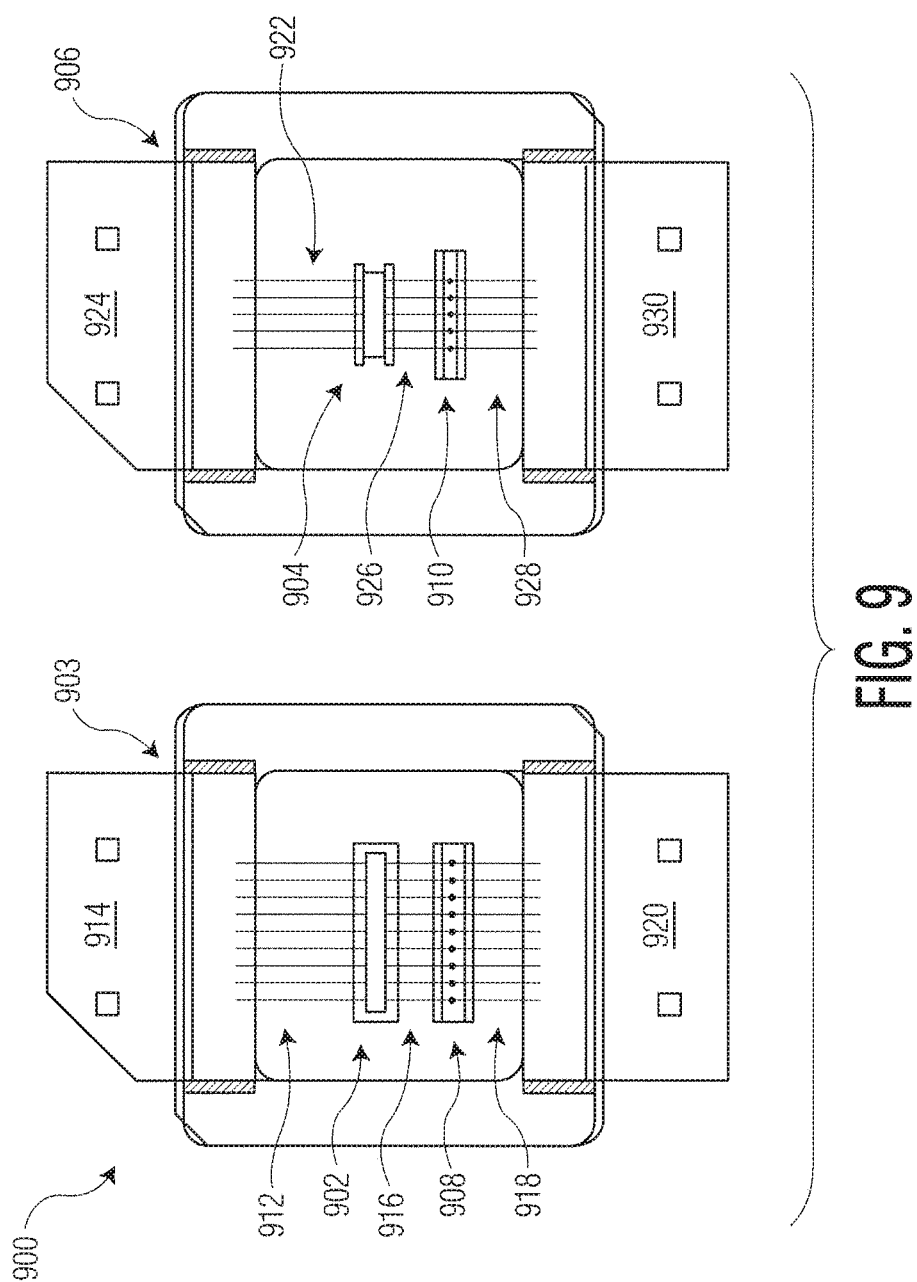
FIG. 9 is a top plan view of an example embodiment of a dual-package implementation of a Doherty power amplifier circuit as represented (at least in part) by FIG. 1 that has a main amplifier and a size-optimized peaking amplifier, which can for example be provided by a portion of the die of FIGS. 3, 5, 6, and 7.
Figure 10:
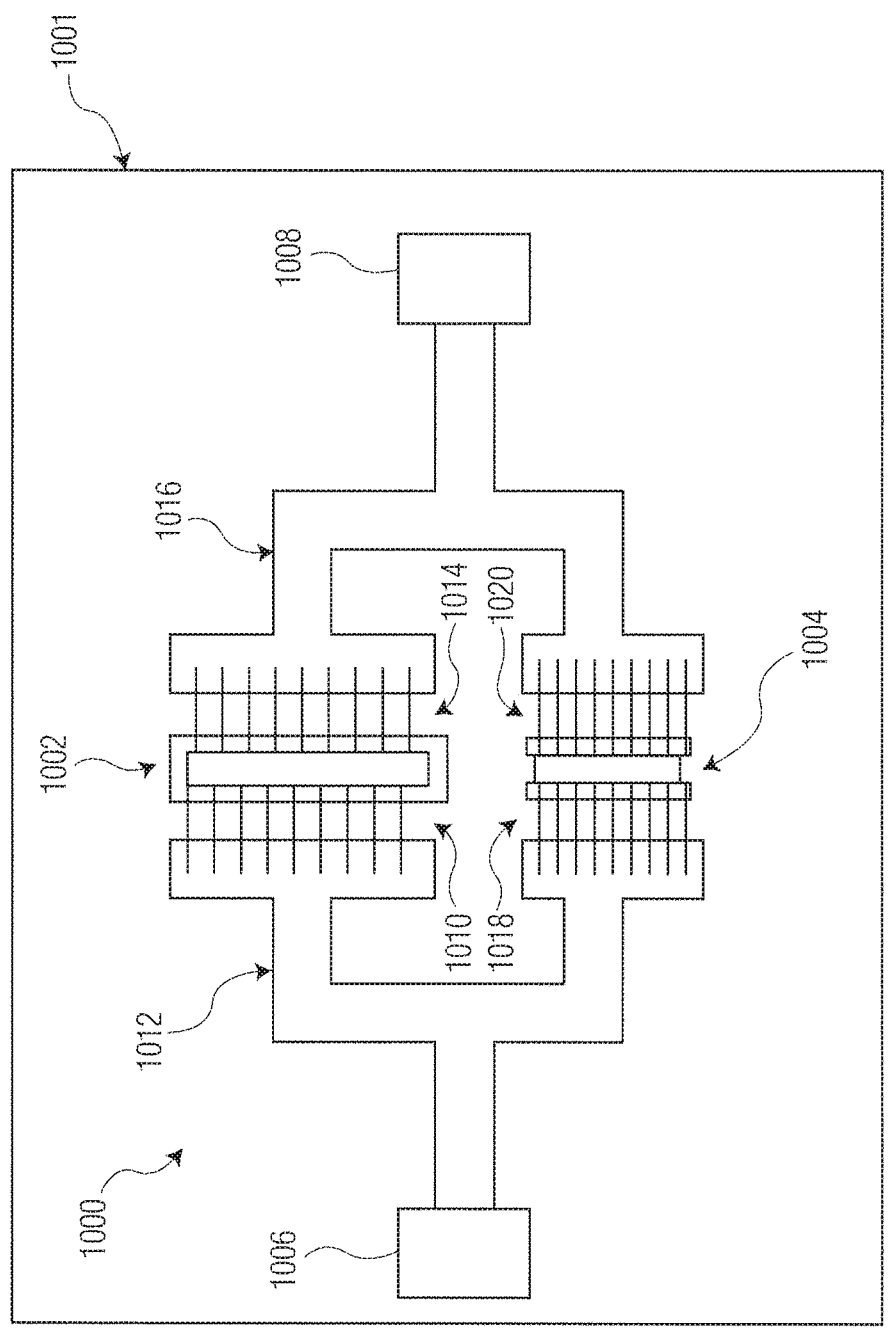
FIG. 10 is a top plan (e.g., layout) view of an example embodiment of a Doherty power amplifier circuit as represented (at least in part) by FIG. 1 that has a main amplifier and a size-optimized peaking amplifier, which can for example be provided by a portion of the die of FIGS. 3, 5, 6, and 7, where the circuit is implemented in an integrated manner.

Turning now to FIG. 8, FIG. 9, and FIG. 10, Doherty PA circuits having peaking amplifier circuits in accordance with the embodiment shown in FIGS. 3, 5, 6, and 7 (or other embodiments encompassed herein), can take any of a variety of forms. FIG. 8 particularly illustrates a top view of a portion of an asymmetric Doherty PA circuit 800 (with asymmetry of approximately 2:1) having a main amplifier die 802 and a smaller (or shrunken) peaking amplifier die 804 arranged side-by-side in a single package 806. In this example embodiment, each of the main amplifier die 802 and the peaking amplifier die 804 is coupled in relation to a respective integrated passive device (IPD) 808 and 810, respectively, each of which is also formed on the package 806. More particularly as shown, the main amplifier die 802 is coupled by way of a first set of wire bonds 812 to a first lead 814 of the package 806. Additionally, on its opposite side, the main amplifier die 802 is coupled to the IPD 808 by way of a second set of wire bonds 816, and the IPD 808 is in turn coupled by way of a third set of wire bonds 818 to a second lead 820 of the package 806. As for the peaking amplifier die 804, it is coupled by way of a fourth set of wire bonds 822 to a third lead 824 of the package 806, and additionally is coupled by way of a fifth set of wire bonds 826 to the IPD 810, which in turn is coupled by way of a sixth set of wire bonds 828 to a fourth lead 830 of the package 806. In the present embodiment, the second lead 820 constitutes the input terminal to the main amplifier die 802, which is coupled to the second lead by way of the wire bonds 816 and 818 as well as the IPD 808. By virtue of these connections, the second lead 820 constitutes the gate input terminal of the main amplifier die 802. Further, the first lead 814 that is coupled to the main amplifier die 802 by way of the wire bonds 812 constitutes the drain output of the main amplifier die. Further as shown, the fourth lead 830, which is coupled to the peaking amplifier die 804 by way of the fifth wire bonds 826, the sixth wire bonds 828 and the IPD 810 connected therebetween, constitutes the gate input terminal of the peaking amplifier die 804. Further, the third lead 824 that is coupled to the peaking amplifier die 804 by way of the fourth wire bonds 822 constitutes the drain output connection of the peaking amplifier die. Not shown in FIG. 8 are the Doherty PA circuit power divider (which would be coupled to the second and fourth leads 820 and 830, which as noted above are input terminals or leads) and combiner (which would be coupled to the first and third leads 814 and 824, which as noted above are output terminals or leads).

The peaking amplifier die 804 can take the form shown in FIGS. 3, 5, 6, and 7, or other forms in accordance herein. In accordance with the description already provided regarding FIGS. 3, 5, 6, and 7, the peaking amplifier die 804 of FIG. 8 is illustrated as being substantially smaller than the main amplifier die 802. In this example, the peaking amplifier die 804 particularly is approximately half the size of the main amplifier die 802. Further, in the present embodiment, the peaking amplifier die 804 is size optimized. Indeed, the peaking amplifier die 804, although physically smaller than the main amplifier die 802, nonetheless has about two times the gate periphery of the main amplifier die 802. The peaking amplifier die 804 thus is much more densely packed than the main amplifier die and, because the peaking amplifier die 804 is (about) half the size of the main amplifier die 802, this implies that the peaking amplifier circuit has (about) four times the thermal density of the main amplifier die.

Referring to FIG. 9, in a further embodiment, a portion of a Doherty PA circuit 900 includes a main amplifier die 902 that is provided on a first package 903 and a peaking amplifier die 904 that is provided on a second package 906. Each of the first package 903 and the second package 906 is a two-lead package (in contrast with the package 806 of FIG. 8, which is a four-lead package). The portion of the Doherty PA circuit 900 is substantially the same as the portion of the Doherty PA circuit 800 of FIG. 8 except insofar as the main amplifier die 902 and associated circuitry is separately packaged from the peaking amplifier die 904 and associated componentry, on the separate packages 903 and 906, rather than being integrated on a single package. Thus, similar to the arrangement of FIG. 8, the Doherty PA circuit 900 of FIG. 9 is an asymmetric Doherty PA circuit (again having approximately 2:1 asymmetry) in which the peaking amplifier die 904 is smaller than (or shrunken relative to) the main amplifier die 902. Substantially the same as shown in regard to FIG. 8, the main amplifier die 902 is coupled to an IPD 908 and the peaking amplifier die 904 is coupled to an IPD 910, where the respective IPDs are on the respective packages 903 and 906.

Further as shown, the main amplifier die 902 is coupled by way of first wire bonds 912 to a first lead 914 of the first package 903, and coupled by way of a second set of wire bonds 916 to the IPD 908, which in turn is coupled to a second lead 920 by way of a third set of wire bonds 918. Similarly, the peaking amplifier die 904 is coupled to a third lead 924, which is the first lead of the second package 906, by way of a fourth set of wire bonds 922. Additionally, the peaking amplifier die 904 is coupled to the IPD 910 by a fifth set of wire bonds 926, with the IPD 910 in turn being coupled to a fourth lead 930 (which is the second lead of the second package 906) by way of a sixth set of wire bonds 928. Again, as discussed with regard to FIG. 8, the main amplifier die 902 is substantially double in size relative to the peaking amplifier die 904. Again, the peaking amplifier die 904 is size optimized (or enhanced) and physically compact by comparison with the main amplifier die 902. Not shown in FIG. 9 are the Doherty PA circuit power divider (which would be coupled to the second and fourth leads 920, 930, which are input terminals or leads) and combiner (which would be coupled to the first and third leads 914 and 924, which are output terminals or leads).

Turning to FIG. 10, in a further embodiment, a Doherty PA circuit 1000 takes the form of an asymmetric Doherty PA circuit having a main amplifier die and a smaller (or shrunken) peaking amplifier die in a fully integrated environment 1001. In this example, the Doherty PA circuit 1000 includes a main amplifier die 1002 and a peaking amplifier die 1004 that are coupled to a common substrate (e.g., a PCB) in parallel between a RF input terminal 1006 and a RF output terminal 1008. The main amplifier die 1002 is coupled by way of a first set of wire bonds 1010 to a linkage 1012 (e.g., a power splitter, where the phase shift features are not illustrated for simplicity) that in turn is coupled directly to the RF input terminal 1006. Further, the main amplifier die 1002 also is coupled by way of a second set of wire bonds 1014 to a second linkage 1016 (e.g., a power combiner, where the phase shift features are not illustrated for simplicity) by which the wire bonds are coupled to the RF output terminal 1008. Further, the peaking amplifier die 1004 is coupled by way of a third set of wire bonds 1018 to the linkage 1012, by which the peaking amplifier die 1004 also is coupled to the RF input terminal 1006. Additionally, the peaking amplifier die 1004 also is coupled by a way of a fourth set of wire bonds 1020 to the linkage 1016, by which the peaking amplifier die 1004 is also coupled to the RF output terminal 1008.

As was discussed with respect to the Doherty PA circuits 800 and 900 of FIG. 8 and FIG. 9, the Doherty PA circuit 1000 of FIG. 10 is an asymmetric Doherty PA circuit (with asymmetry of approximately 2:1) in which the peaking amplifier die 1004 is shrunk or smaller than the main amplifier die 1002. Again, as described with respect to FIG. 8 and FIG. 9, this asymmetry is evident in FIG. 10 both from the relative larger size of the main amplifier die 1002 relative to the peaking amplifier die 1004 as illustrated. As with the peaking amplifier dies of the Doherty PA circuits 800 and 900, the peaking amplifier die 1004 of the Doherty PA circuit 1000 can take the form as described above in regard to FIGS. 3, 5, 6, and 7 (or other forms encompassed herein), is size optimized or enhanced, and also occupies less physical space than the main amplifier die 1002 of the Doherty PA circuit 1000.

Figure 11:
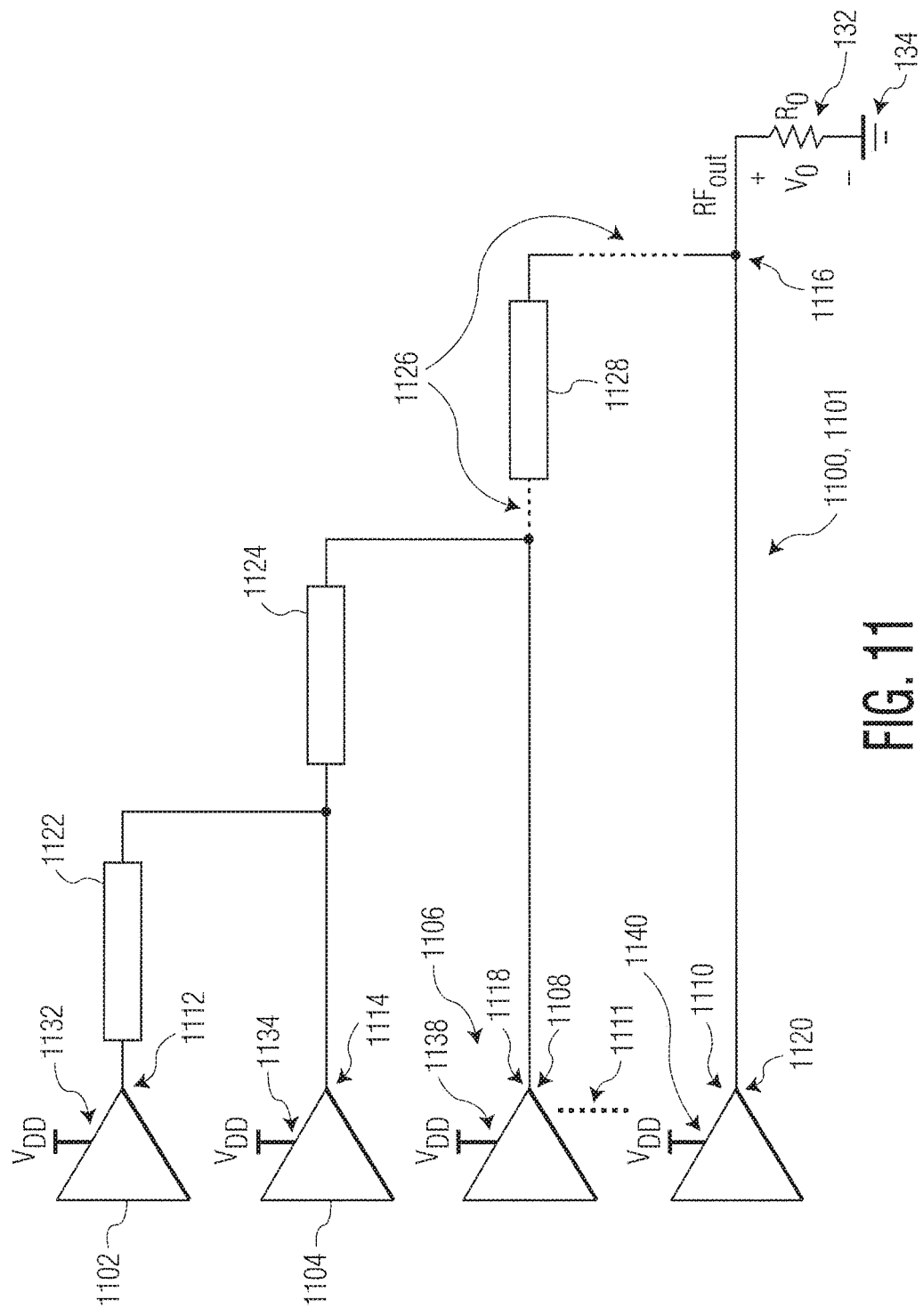
FIG. 11 is a schematic diagram illustrating an additional example Doherty power amplifier circuit that differs from that of FIG. 1 and that can employ one or more size-optimized components in accordance with embodiments encompassed herein.

Referring to FIG. 11, although FIG. 1, FIG. 8, FIG. 9, and FIG. 10 envision Doherty PA circuits that employ a single main amplifier circuit and a single peaking amplifier circuit, the present disclosure is intended to encompass other types of Doherty PA circuits as well, including Doherty PA circuits that have more than one peaking amplifier circuit. For example, FIG. 11 is a schematic diagram 1100 of a portion of a N-way Doherty PA circuit that particularly constitutes an output portion or output configuration 1101 of the Doherty PA circuit. The output configuration 1101 particularly includes a main amplifier circuit 1102, a first peaking amplifier circuit 1104, and N−2 additional peaking amplifier circuits 1106. The N−2 additional peaking amplifier circuits 1106 is/are intended to be representative of one or more additional peaking amplifier circuits that particularly are in addition to the first peaking amplifier circuit 1104.

As an example, the schematic diagram 1100 particularly shows the N−2 additional peaking amplifier circuits 1106 as encompassing a first additional peaking amplifier circuit 1108 and a second additional peaking amplifier circuit 1110. In such example embodiment, the output configuration 1101 is that of a N-way Doherty PA circuit in which N=4, that is, in which there are three peaking amplifier circuits shown as the peaking amplifier circuits 1104, 1108, and 1110. Notwithstanding what is shown in FIG. 11, however, and as represented by an ellipsis 1111, the actual number of additional peaking amplifier circuits encompassed by the amplifier circuits 1106 is arbitrary and can include one, two, or more than two peaking amplifier circuits depending upon the embodiment. It should further be appreciated from FIG. 1 that each of the main and peaking amplifier circuits 1102, 1104, 1108, and 1110 is coupled to a power supply (shown as having a voltage $V_{DD}$) at a respective power terminal 1132, 1134, 1138, and 1140.

Further as shown in FIG. 11, the main amplifier circuit 1102 and the peaking amplifier circuits 1104, 1108, and 1110 have respective output terminals, which in the present embodiment are shown to be output terminals 1112, 1114, 1118 and 1120, respectively. Also as shown in FIG. 11, each of the output terminals 1112, 1114, 1118 and 1120 is coupled at least indirectly with a RF output terminal 1116 of the output configuration 1101. The RF output terminal 1116 is coupled to a load, which in the present example can be the load 132 and be coupled between the output terminal 1116 and the ground terminal 134 in a manner similar to that shown in FIG. 1.

Additionally, similar to the manner in which the output terminal 126 of the main amplifier circuit 106 in FIG. 1 is coupled to the combining node (output terminal) 130 by way of the second 90 degree phase shift and impedance inversion element (or second quarter wave transmission line or transformer section) 110, several quarter wave transmission lines are present in the output configuration 1101. More particularly, a first quarter wave transmission line 1122 is coupled between the output terminal 1112 of the main amplifier circuit 1102 and the output terminal 1114 of the first peaking amplifier circuit 1104. Further, because the output configuration 1101 includes more than a single peaking amplifier circuit, the output terminal 1114 of the first peaking amplifier circuit 1104 is not directly coupled to the RF output terminal 1116, but rather a first additional quarter wave transmission line 1124 is coupled between the output terminal 1114 and the output terminal 1118 of the first (N−2) additional peaking amplifier circuit 1108, and a second additional quarter wave transmission line 1128 is coupled between the output terminal 1118 and the output terminal 1120 of the second (N−1) additional peaking amplifier circuit 1110, which is directly coupled to the RF output terminal 1116.

Although FIG. 11 only shows the output configuration 1101, it should be appreciated that the output configuration is intended to represent only a part of an overall Doherty PA circuit that would also include, in addition to the output configuration, an input portion or input configuration. Such an input configuration portion would correspond to the power divider (or splitter) 102 and quarter wave transmission line 104, by which RF input signals would be provided to the various main and peaking amplifier circuits of the output configuration 1101 (e.g., to the main and peaking amplifier circuits 1102, 1104, 1106). Just as the output configuration includes the sequentially-connected quarter wave transmission lines 1122, 1124, and 1128 linking the various amplifier circuits 1102, 1104, and 1106, likewise the input configuration in such an embodiment would include more than one quarter wave transmission line linking the power splitter with successive ones of the peaking amplifier circuits 1102, 1104, 1106. Although a particular arrangement of output transmission lines 1122, 1124, 1128 is shown in FIG. 11, other arrangements also could be used, and such output arrangements would depend on the phase shifts applied to the RF signals at the inputs to the amplifier circuits 1102, 1104, 1106, 1108.

Further it should be appreciated that, in embodiments of Doherty PA circuits represented by FIG. 11 having multiple peaking amplifier circuits in addition to a main amplifier circuit (rather than only a single peaking amplifier circuit), the respective physical die area to total gate periphery ratio associated with each of the peaking amplifier circuits (or each of the transistors employed in each such circuit) can be smaller than a physical die area to total gate periphery ratio associated with the main amplifier circuit (or a transistor employed in such circuit), by at least 30% or even higher, and possibly by different amounts depending upon the peaking amplifier circuit in question (e.g., one of the peaking amplifier circuits can have a respective physical die area to total gate periphery ratio that is smaller than that of another peaking amplifier circuit). Also, in embodiments of Doherty PA circuits represented by FIG. 11 having multiple peaking amplifier circuits in addition to a main amplifier circuit (rather than only a single peaking amplifier circuit), the respective source-to-drain pitch associated with each of the peaking amplifier circuits (or each of the transistor employed in each such circuit) can be smaller than a source-to-drain pitch associated with the main amplifier circuit (or a transistor employed in such circuit), by at least 30% or even higher, and possibly by different amounts depending upon the peaking amplifier circuit in question (e.g., one of the peaking amplifier circuits can have a smaller source-to-drain pitch—for example, one constituting a reduction of 30% relative to that of the main amplifier circuit—than that of another peaking amplifier circuit, which could for example be a reduction of 25% relative to that of the main amplifier circuit).

Figure 12:
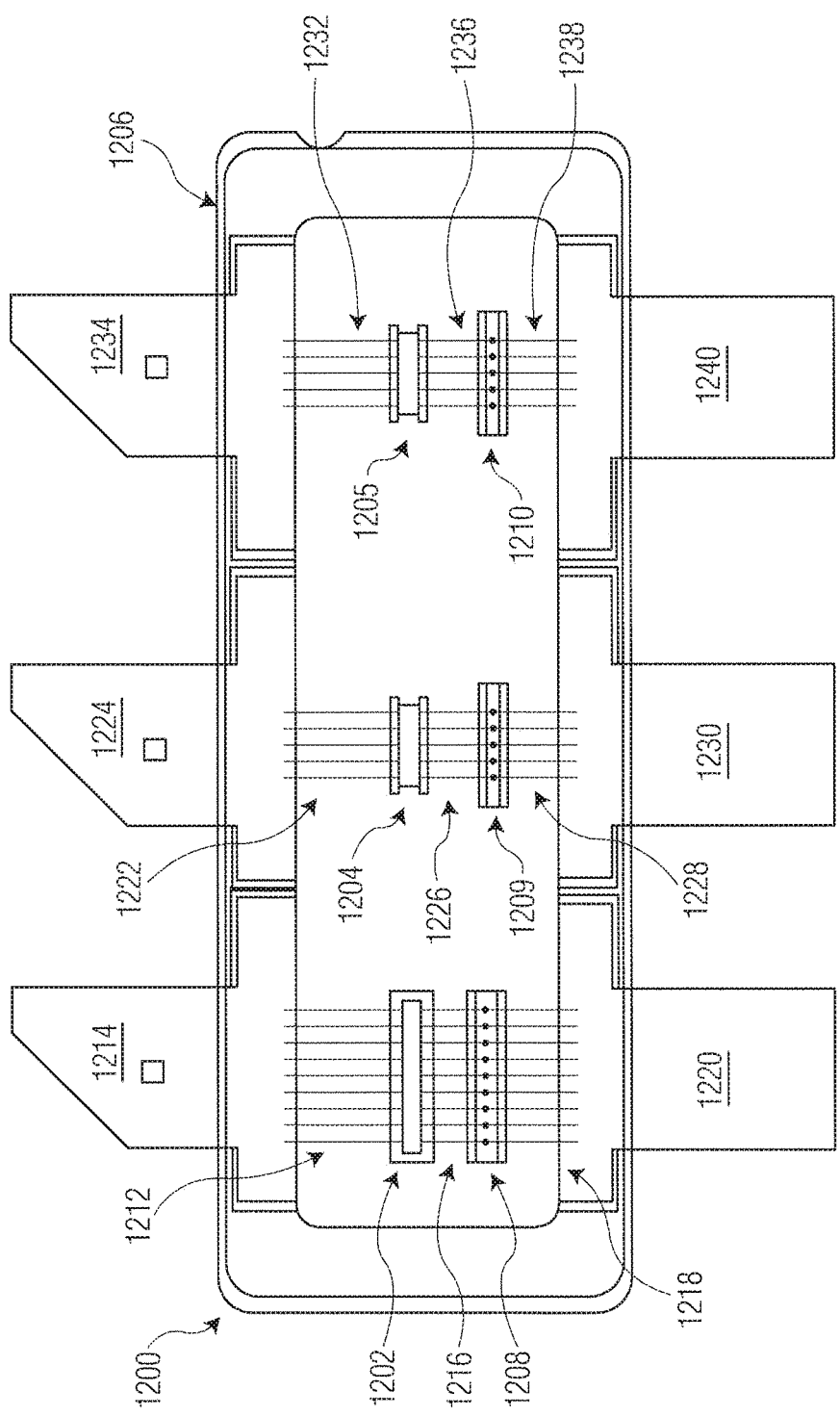
FIG. 12 is a top plan view of an example embodiment of a single-package implementation of a Doherty power amplifier circuit as represented (at least generally) by FIG. 11 that has a main amplifier and two size-optimized peaking amplifiers, each of which can, for example, be provided by a portion of the die of FIGS. 3, 5, 6, and 7.

Given that the present disclosure is intended to encompass additional forms of Doherty PA circuits that include more than one peaking amplifier circuit, such as that represented in part by the output configuration 1101 of FIG. 11, it should be appreciated that the present disclosure is also intended to encompass numerous different package arrangements and implementation arrangements for such Doherty PA circuits that are analogous to those of FIGS. 8, 9, and 10. More particularly in this regard, FIG. 12 illustrates a Doherty PA circuit 1200 that is analogous to that of FIG. 8 insofar as all of the main and peaking amplifier dies of the Doherty PA circuit are provided on a single package 1206, which in this embodiment is a six lead package. More particularly as shown, the Doherty PA circuit 1200 is an asymmetric three-way Doherty PA circuit (with asymmetry of approximately 2:2:1) having particularly a main amplifier die 1202, a first peaking amplifier die 1204, and a second peaking amplifier die 1205, where each of the peaking amplifier dies is size optimized (or enhanced). The Doherty PA circuit 1200 corresponds (in terms of the output portion thereof) to a version of the output configuration 1101 in which N=3, i.e., a version in which the additional peaking amplifier circuits 1106 only include the first additional peaking amplifier circuit 1108 in addition to the peaking amplifier circuit 1104.

Also as shown in FIG. 12, each of the main amplifier die 1202, first peaking amplifier die 1204, and second peaking amplifier die 1205 is coupled to a respective IPD 1208, 1209, and 1210. The main amplifier die 1202 is coupled by way of a first set of wire bonds 1212 to a first lead 1214, and also is coupled to the first IPD 1208 by a second set of wire bonds 1216, with that IPD being in turn coupled by a third set of wire bonds 1218 to a second lead 1220. Further, the first peaking amplifier die 1204 is coupled by way of a fourth set of wire bonds 1222 to a third lead 1224, and also is coupled to the second IPD 1209 by way of a fifth set of wire bonds 1226, which in turn is coupled by a sixth set of wire bonds 1228 to a fourth lead 1230. Additionally, the second peaking amplifier die 1205 is coupled by way of a seventh set of wire bonds 1232 to a fifth lead 1234, and further is coupled to the third IPD 1210 by way of an eighth set of wire bonds 1236 which in turn is coupled by way of a ninth set of wire bonds 1238 to a sixth lead 1240.

In this embodiment, each of the peaking amplifier dies 1204 and 1205 is size optimized (or enhanced) and is physically smaller (or shrunken) by comparison with the main amplifier die 1202. This is evident from the relative sizes of the peaking amplifier dies 1204, 1205 by comparison with the main amplifier die 1202 as illustrated. Similar to the embodiment of FIG. 8, the second, fourth, and sixth leads 1220, 1230, and 1240 of FIG. 12 (in this illustration, the bottom leads) respectively are the gate input terminals for the main amplifier die 1202, the first peaking amplifier die 1204, and the second peaking amplifier die 1205, respectively. Also, the first, third, and fifth leads 1214, 1224, and 1234 of FIG. 12 (in this illustration, the top leads) are the drain output terminals for the main amplifier die 1202, the first peaking amplifier die 1204, and the second peaking amplifier die 1205.

Figure 13:
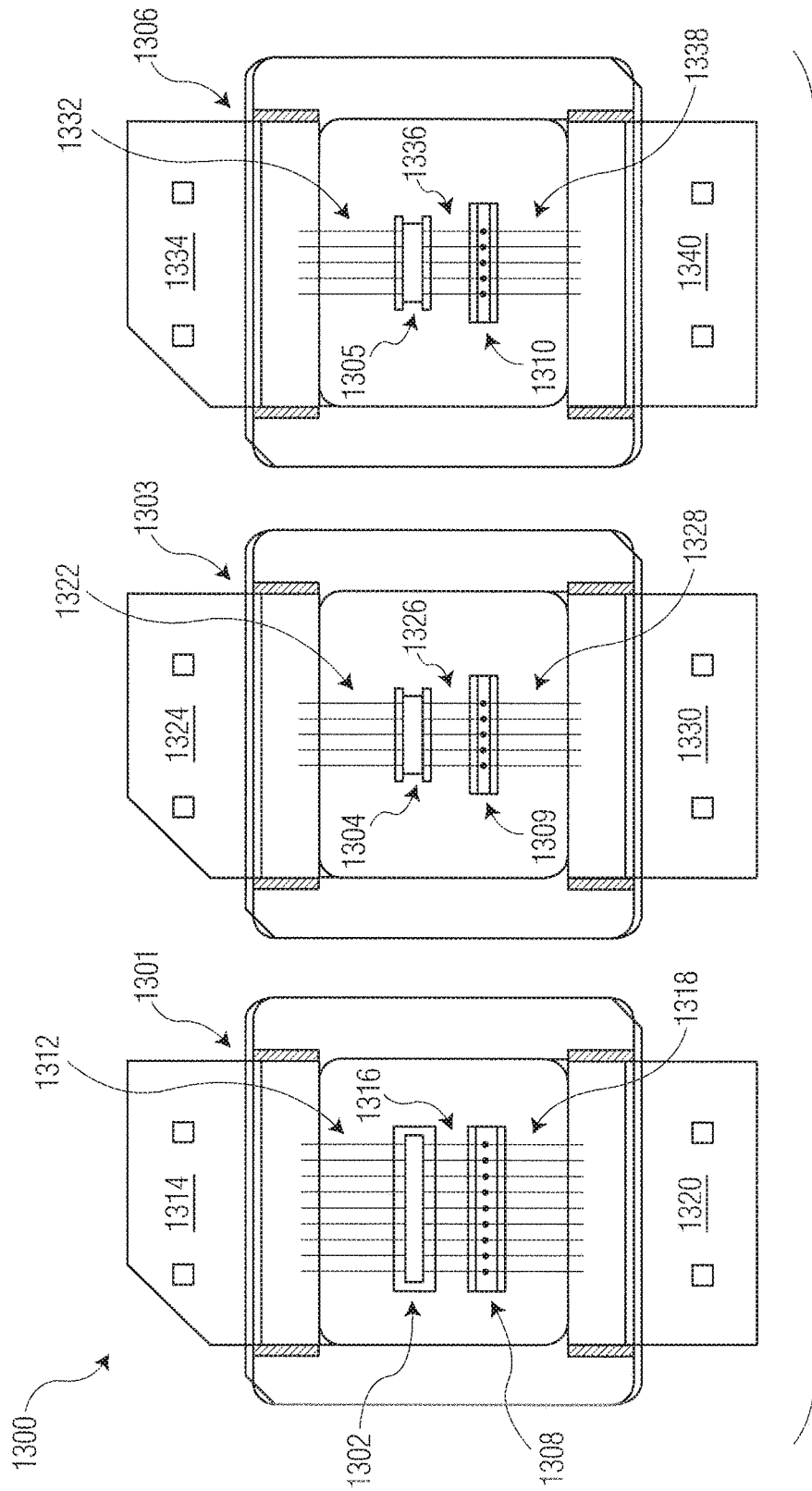
FIG. 13 is a top plan view of an example embodiment of a triple-package implementation of a Doherty power amplifier circuit as represented (at least generally) by FIG. 11 that has a main amplifier and two size-optimized peaking amplifiers, each of which can, for example, be provided by a portion of the die of FIGS. 3, 5, 6, and 7.

Referring to FIG. 13, the present disclosure also is intended to encompass another embodiment of a Doherty PA circuit having components that are substantially similar to those of FIG. 12 but that are provided by multiple (in this example, three) packages. For this reason, the embodiment of FIG. 13 relates to that of FIG. 12 in a manner similar to the relationship between the embodiments of FIG. 9 and FIG. 8 described above. More particularly, the Doherty PA circuit 1300 of FIG. 13 includes a main amplifier die 1302 and associated circuitry, a first peaking amplifier die 1304 and associated circuitry, and second peaking amplifier die 1305 and associated circuitry, which are respectively positioned on a first package 1301, a second package 1303, and a third package 1306. Again as with respect to the embodiment of FIG. 12, the Doherty PA circuit 1300 is an asymmetric Doherty PA circuit (with asymmetry of approximately 2:2:1) in which the first and second peaking amplifier dies 1304 and 1305 are size optimized (or enhanced) and physically smaller (or shrunken) by comparison with the main amplifier die 1302. The Doherty PA circuit 1300 corresponds (in terms of the output portion thereof) to a version of the output configuration 1101 in which N=3, i.e., a version in which the additional peaking amplifier circuits 1106 only include the first additional peaking amplifier circuit 1108 in addition to the peaking amplifier circuit 1104.

Although the main amplifier die 1302 and associated circuitry, the first peaking amplifier die 1304 and associated circuitry, and the second peaking amplifier die 1305 and associated circuitry are provided respectively on the individual packages 1301, 1303, and 1306, respectively, otherwise the components and layout of the Doherty PA circuit 1300 is similar to that of the Doherty PA circuit 1200 of FIG. 12. In particular, the main amplifier die 1302 is coupled to a first IPD 1308, the first peaking amplifier die 1304 is coupled to a second IPD 1309, and the second peaking amplifier die 1305 is coupled to a third IPD 1310. Further, the main amplifier die 1302 and first IPD 1308 are coupled in series relative to one another between a first lead 1314 and a second lead 1320 of the first package 1301, which respectively constitute the drain output terminal and gate input terminal of the main amplifier circuit. The coupling of these components is achieved by way of first, second, and third sets of wire bonds 1312, 1316, and 1318 that correspond to the first, second, and third sets of wire bonds 1212, 1216, and 1218 of FIG. 12.

Also, on the second package 1303, the first peaking amplifier die 1304 is coupled in series with the second IPD 1309 between a third lead 1324 and fourth lead 1330 in substantially the same manner that the first peaking amplifier die 1204 and IPD 1209 are coupled between the leads 1224 and 1230 in FIG. 12. The coupling of these components is achieved by way of fourth, fifth, and sixth sets of wire bonds 1322, 1326, and 1328 that fulfill substantially the same roles as the sets of wire bonds 1222, 1226, and 1228 of FIG. 12, respectively. Additionally, with respect to the third package 1306, the second peaking amplifier die 1305 is coupled in series with the third IPD 1310 between a fifth lead 1334 and sixth lead 1340 in substantially the same manner as the second peaking amplifier die 1205 and IPD 1210 are coupled between the leads 1234 and 1240 in FIG. 12. More particularly as shown, seventh, eighth, and ninth wire bonds 1332, 1336, and 1338 link the fifth lead 1334, sixth lead 1340, second peaking amplifier die 1305 and the IPD 1310 with one another in substantially the same manner as the sets of wire bonds 1232, 1236, and 1238 of FIG. 12 link the leads 1234, 1240, second peaking amplifier die 1205 and IPD 1210 with one another in FIG. 12.

Figure 14:
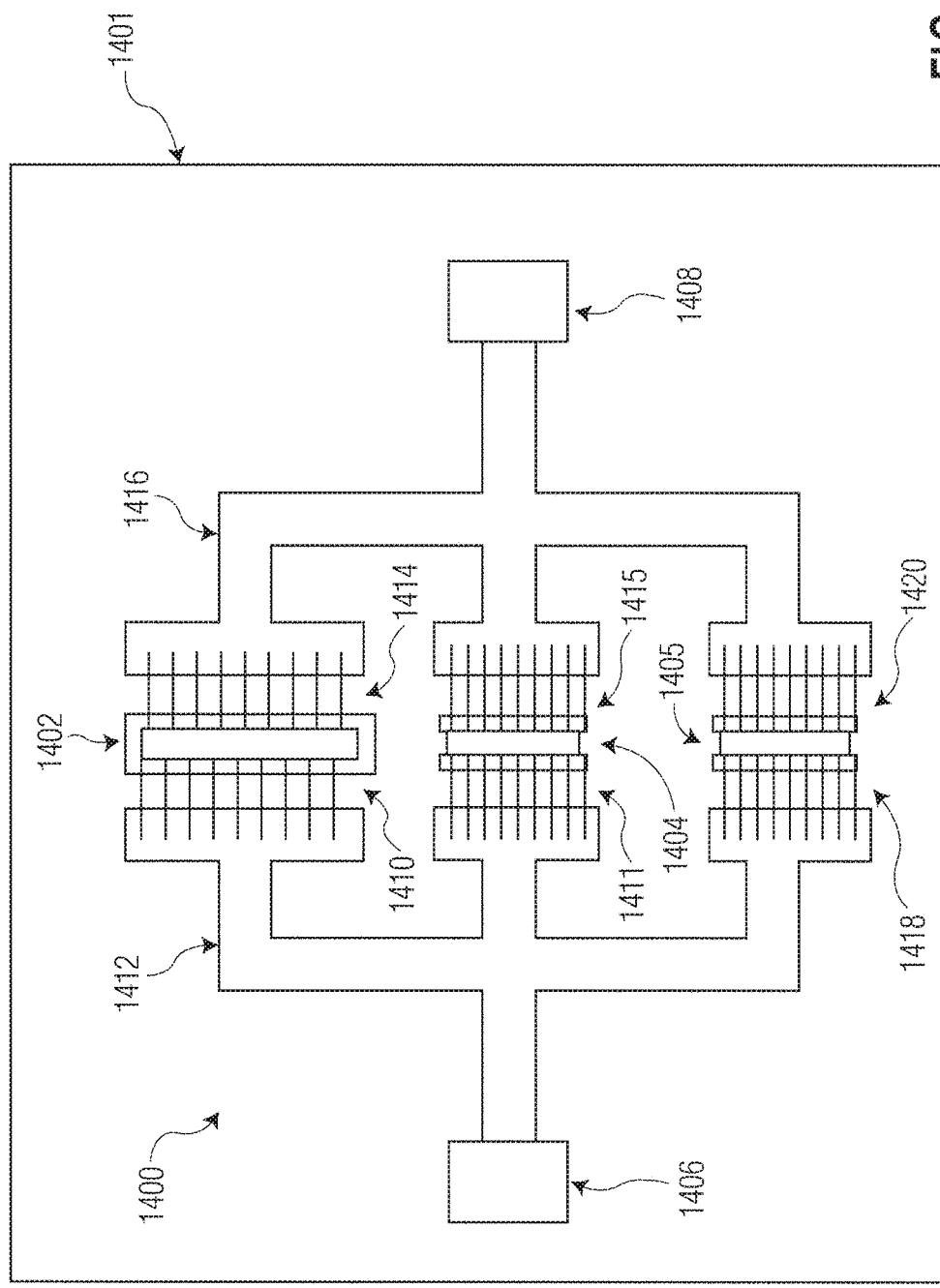
FIG. 14 is a top plan view of an example embodiment of a Doherty power amplifier circuit as represented (at least generally) by FIG. 11 that has a main amplifier and two size-optimized peaking amplifiers, each of which can, for example, be provided by a portion of the die of FIGS. 3, 5, 6, and 7, where the circuit is implemented in an integrated manner.

Referring to FIG. 14, a further Doherty PA circuit 1400 is shown in which the entire PA circuit is mounted or provided on an integrated environment 1401 (e.g., a PCB). As with the Doherty PA circuits of FIGS. 12 and 13, the Doherty PA circuit 1400 is an asymmetric three-way Doherty PA circuit (with asymmetry of approximately 2:2:1) having a main amplifier die 1402, a first peaking amplifier die 1404, and a second peaking amplifier die 1405. It should be appreciated that the arrangement in FIG. 14 is similar to that of FIG. 10 except insofar as, instead of there being only the single peaking amplifier die 1004 shown in FIG. 10, the Doherty PA circuit 1400 of FIG. 14 includes both the first and the second peaking amplifier dies 1404 and 1405, respectively. Again as with respect to the embodiment of FIGS. 12 and 13, the Doherty PA circuit 1400 is an asymmetric Doherty PA circuit in which the first and second peaking amplifier dies 1404 and 1405 are size optimized (or enhanced) and physically smaller (or shrunken) by comparison with the main amplifier die 1402. The Doherty PA circuit 1400 corresponds (in terms of the output portion thereof) to a version of the output configuration 1101 in which N=3, i.e., a version in which the additional peaking amplifier circuits 1106 only include the first additional peaking amplifier circuit 1108 in addition to the peaking amplifier circuit 1104.

Similar to the embodiment of FIG. 10, the main amplifier die 1402, the first peaking amplifier die 1404, and the second peaking amplifier die 1405 are coupled in parallel with one another between an RF input terminal 1406 and an RF output terminal 1408 by way of a first linkage 1412 (e.g., a power splitter, where the phase shift features are not illustrated for simplicity) and a second linkage 1416 (e.g., a power combiner, where the phase shift features are not illustrated for simplicity), which respectively are directly coupled to the input terminal 1406 and output terminal 1408, respectively. Further as shown, first and second sets of wire bonds 1410 and 1414 respectively couple the main amplifier die 1402 with the first linkage 1412 and the second linkage 1416, respectively, third and fourth sets of wire bonds 1411 and 1415 respectively couple the first peaking amplifier die 1404 with the first linkage 1412 and the second linkage 1416, respectively, and fifth and sixth sets of wire bonds 1418 and 1420 respectively couple the second peaking amplifier die 1405 with the first linkage 1412 and the second linkage 1416, respectively. Also similar to as discussed with respect to FIG. 10, each of the first and second peaking amplifier dies 1404 and 1405 are smaller (or shrunken) by comparison with the main amplifier die 1402, as exemplified both by the relative sizes of the peaking amplifier dies relative to the main amplifier die as illustrated in the FIG. 14.

From the above description, it should be appreciated that various embodiments of Doherty PA circuits encompassed herein can achieve any one or more of a variety of benefits or advantages by comparison with conventional circuits. As already discussed, in certain embodiments, overall compactness of the Doherty PA circuit, or the compactness of one or more amplifier circuits such as one or more peaking amplifier circuits within a Doherty PA circuit, can be enhanced. In some example embodiments, peaking dies that are 30% to 60% smaller (or 35% smaller, 65% smaller, or even more) than conventional peaking dies are achievable. By implementing dies with smaller die area, it is possible as well to implement Doherty PA circuits using smaller, less expensive packaging as well. Such miniaturization of circuits can represent improvements not only in direct cost, but also result in enhancements in terms of parameters such as the weight or volume of systems or products within which the circuits are implemented, such as cellular or mobile device systems or base-station systems or products (which can be significant as the majority of applications are now remote radio head (RRH) or mast-head based).

In some embodiments encompassed herein, one or more of these or other benefits or advantages can be achieved by implementing one or more source vias that are aligned with two source contacts or multiple source contacts. More particularly, to allow a tighter source-to-drain (source/drain) pitch, without dramatically increasing source inductance (or correspondingly hurting RF gain), the source vias can be positioned/moved below sets of multiple source contacts so as to keep the source to ground connection uniform for the source contacts (in at least some cases, for all of the source contacts) and at a low inductance. In other words, in at least some embodiments, the implementation of source vias in this manner can achieve one or more of a tighter source-to-drain pitch, a minimum (or minimized) source inductance penalty, and a consistent source-to-ground path for different (or, in at least some cases, all) source contacts, while only possibly experiencing a small penalty in terms of increased Y-dimension size (with Y-dimension being understood as described above).

In at least some such embodiments, wire-bond pads are kept at a width sufficient to allow enough parallel wire-bond connections to both handle the average drain current (with margin to keep wire-bond temperatures to less than or equal to a 200 degrees Celsius maximum temperature), and to allow the impedance match connection to internal passives, or package leads, to be at a low enough Q (ratio of reactance to resistance) to allow the RF bandwidth requirement to be acceptable. Also, in at least some embodiments of the improved Doherty power amplifier circuits encompassed herein, an initial load pull of the peaking die vs control shows equivalent gain (Gp) and higher efficiency by comparison with conventional Doherty PA circuits (and also tests have shown no wire damage following P3 dB pulsed load pull).

It should be appreciated that the present disclosure is intended to encompass numerous embodiments of circuits, systems, and methods of operation, manufacture, and implementation including, but not limited to, those described above. Although the present disclosure among other things describes several Doherty PA circuits, it should be appreciated that the present disclosure is intended to encompass numerous other forms of Doherty PA circuits in addition to those described above, other forms of multi-path PA or other amplifier circuits, and other circuits, as well as a variety of amplifiers, mobile devices, communication systems, and other systems employing any of such circuits. Although it is envisioned that, in at least some embodiments encompassed herein, the amplifier circuits (including the peaking amplifier circuits) and associated transistors or other components will be gallium-nitride (GaN) semiconductor devices, the present disclosure is also intended to encompass embodiments in which the amplifier circuits or associated transistors or other components employ or be manufactured using other semiconductor materials. For example, in some embodiments, the transistors can be LDMOS (laterally diffused metal oxide semiconductor) silicon-based devices, silicon-germanium (SiGe) devices, gallium-arsenide (GaAs) devices, or III-V type material-based devices.

Further, the present disclosure is intended to encompass methods of manufacturing or otherwise implementing such circuits and systems. For example, the present disclosure is intended to encompass methods of manufacturing or implementing Doherty PA circuits or other circuits in which source vias are provided that are aligned with two source contacts, or more than two source contacts. Also for example, the present disclosure is intended to encompass methods of manufacturing or implementing Doherty PA circuits or other circuits or in which one or more peaking amplifier circuits are implemented in relation to one or more main amplifier circuits, where the peaking amplifier die(s) are of substantially smaller size than the main amplifier die.

Additionally, in accordance with at least one example embodiment encompassed herein, a multi-path power amplifier includes a first semiconductor die with an integrated first transistor having a first source-to-drain pitch, and a second semiconductor die with an integrated second transistor having a second source-to-drain pitch. The second source-to-drain pitch is smaller than the first source-to-drain pitch by at least 30 percent.

Further, in accordance with at least one additional example embodiment encompassed herein, a Doherty amplifier system includes a first semiconductor die with an integrated first transistor for a main amplifier, and a second semiconductor die with an integrated second transistor for a peaking amplifier. The first semiconductor die has a first physical die area to total gate periphery ratio, the second semiconductor die has a second physical die area to total gate periphery ratio, and the second physical die area to total gate periphery ratio is smaller than the first physical die area to total gate periphery ratio by at least 30 percent.

Additionally, in accordance with at least one further example embodiment encompassed herein, a method of implementing a power amplifier includes providing a first semiconductor die that includes an integrated first transistor for a main amplifier circuit, where the first semiconductor die has a first physical die area to total gate periphery ratio and a first source-to-drain pitch. The method also includes providing a second semiconductor die that includes an integrated second transistor for a peaking amplifier circuit, where the second semiconductor die has a second physical die area to total gate periphery ratio and a second source-to-drain pitch. Further, the method additionally includes electrically coupling the first transistor to a first gate lead and a first drain lead by way of a plurality of first wire bonds and a plurality of second wire bonds, and electrically coupling the second transistor to a second gate lead and a second drain lead by way of a plurality of third wire bonds and a plurality of fourth wire bonds. Either (a) the second physical die area to total gate periphery ratio is smaller than the first physical die area to total gate periphery ratio by at least 30 percent, or (b) the second source-to-drain pitch is smaller than the first source-to-drain pitch by at least 30 percent.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A multi-path power amplifier comprising:
   a first semiconductor die with an integrated first transistor having a first source-to-drain pitch; and
   a second semiconductor die with an integrated second transistor having a second source-to-drain pitch, wherein the second source-to-drain pitch is smaller than the first source-to-drain pitch by at least 30 percent;
   wherein the second transistor is formed at least in part by way of a first plurality of drain contacts, a second plurality of gate contacts, and a third plurality of source contacts that extend substantially parallel with one another within at least part of a distance between a drain pad and a gate pad, and wherein a source via is positioned between the drain pad and the gate pad, and the source via is coupled at least indirectly with the source contacts of the third plurality.

2. The multi-path power amplifier of claim 1, wherein the multi-path power amplifier is a Doherty power amplifier.

3. The multi-path power amplifier of claim 2, further comprising:
   a main amplifier circuit portion, wherein the first transistor is included in the main amplifier circuit portion; and
   a first peaking amplifier circuit portion, wherein the second transistor is included in the peaking amplifier circuit portion.

4. The multi-path power amplifier of claim 3, wherein the Doherty power amplifier includes an additional peaking amplifier circuit portion.

5. A Doherty power amplifier comprising:
a first semiconductor die with an integrated first transistor having a first source-to-drain pitch;
a second semiconductor die with an integrated second transistor having a second source-to-drain pitch, wherein the second source-to-drain pitch is smaller than the first source-to-drain pitch by at least 30 percent;
a main amplifier circuit portion, wherein the first transistor is included in the main amplifier circuit portion;
a first peaking amplifier circuit portion, wherein the second transistor is included in the peaking amplifier circuit portion; and
an additional peaking amplifier circuit portion, the additional peaking amplifier circuit portion includes a first additional peaking amplifier circuit portion, and wherein the first additional peaking amplifier circuit portion includes a third semiconductor die with an integrated third transistor having a third source-to-drain pitch.

6. The Doherty power amplifier of claim 5, wherein either the third source-to-drain pitch is substantially the same as the second source-to-drain pitch or the third source-to-drain pitch is smaller than the second source-to-drain pitch.

7. The multi-path power amplifier of claim 1, wherein the first and second semiconductor dies are coupled to a first substrate.

8. The multi-path power amplifier of claim 1, wherein the first semiconductor die is coupled to a first substrate, and the second semiconductor die is coupled to a second substrate.

9. The multi-path power amplifier of claim 1, wherein the source via is positioned proximate to ends of the first plurality of drain contacts.

10. The multi-path power amplifier of claim 9, wherein the source via is among a plurality of source vias formed on a die on which the second transistor is formed, wherein the source vias of the plurality of source vias are aligned along an axis defining an X-dimension that is perpendicular to a Y-dimension extending parallel to the drain contacts, and wherein each of the source vias of the plurality of source vias extends through the first substrate between a first metal layer at which portions of the second transistor are formed and a bottom surface of the first substrate at which is provided a metallic backplane.

11. The multi-path power amplifier of claim 3, wherein the main peaking amplifier circuit portion and the first peaking amplifier circuit portion are implemented in a fully integrated manner within a common package.

12. The multi-path power amplifier of claim 1, wherein a second physical die area to total gate periphery ratio of the second transistor is smaller than a first physical die area to total gate periphery ratio of the first transistor by at least 30 percent.

13. A Doherty amplifier system comprising:
a first semiconductor die with an integrated first transistor for a main amplifier, wherein the first semiconductor die has a first physical die area to total gate periphery ratio;
a second semiconductor die with an integrated second transistor for a peaking amplifier, wherein the second semiconductor die has a second physical die area to total gate periphery ratio; and
wherein the second physical die area to total gate periphery ratio is smaller than the first physical die area to total gate periphery ratio by at least 30 percent;
wherein the second transistor is formed at least in part by way of a first plurality of drain contacts, a second plurality of gate contacts, and a third plurality of source contacts that extend substantially parallel with one another at least part of a distance between a drain pad and a gate pad, and wherein a source via is positioned between the drain pad and the gate pad, and is coupled at least indirectly with the source contacts of the third plurality.

14. The amplifier system of claim 13, wherein both of the first and second semiconductor dies are coupled to a substrate that forms a portion of a first package.

15. The amplifier system of claim 13, wherein the first semiconductor die is coupled to a first substrate that forms a portion of a first package, and the second semiconductor die is coupled to a second substrate that forms a portion of a second package.

16. The amplifier system of claim 13, wherein the source via is positioned proximate to ends of the first plurality of drain contacts and extends, along an X-dimension that is perpendicular to a Y-dimension extending parallel to the drain contacts substantially entirely a full distance separating outermost ones of the first plurality of drain contacts.

17. A method of implementing a power amplifier, the method comprising:
providing a first semiconductor die that includes an integrated first transistor for a main amplifier circuit, wherein the first semiconductor die has a first physical die area to total gate periphery ratio and a first source-to-drain pitch;
providing a second semiconductor die that includes an integrated second transistor for a peaking amplifier circuit, wherein the second semiconductor die has a second physical die area to total gate periphery ratio and a second source-to-drain pitch;
electrically coupling the first transistor to a first gate lead and a first drain lead by way of a plurality of first wire bonds and a plurality of second wire bonds; and
electrically coupling the second transistor to a second gate lead and a second drain lead by way of a plurality of third wire bonds and a plurality of fourth wire bonds, wherein either (a) the second physical die area to total gate periphery ratio is smaller than the first physical die area to total gate periphery ratio by at least 30 percent, or (b) the second source-to-drain pitch is smaller than the first source-to-drain pitch by at least 30 percent,
wherein the second semiconductor die includes a source via to which is electrically coupled a plurality of source contacts.

18. The Doherty power amplifier of claim 5, wherein the first and second semiconductor dies are coupled to a first substrate.

19. The Doherty power amplifier of claim 5, wherein the first semiconductor die is coupled to a first substrate, and the second semiconductor die is coupled to a second substrate.

20. The Doherty power amplifier of claim 5, wherein a second physical die area to total gate periphery ratio of the second transistor is smaller than a first physical die area to total gate periphery ratio of the first transistor by at least 30 percent.

* * * * *